(12) United States Patent
Lee et al.

(10) Patent No.: US 11,152,258 B2
(45) Date of Patent: Oct. 19, 2021

(54) METHOD OF FORMING AN INTERCONNECT IN A SEMICONDUCTOR DEVICE

(71) Applicant: Taiwan Semiconductor Manufacturing Company, Ltd., Hsinchu (TW)

(72) Inventors: Pei-Hsuan Lee, Taipei (TW); Chih-Chien Chi, Hsinchu (TW); Yu-Ying Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 16/573,234

(22) Filed: Sep. 17, 2019

(65) Prior Publication Data
US 2021/0082752 A1    Mar. 18, 2021

(51) Int. Cl.
*H01L 21/768* (2006.01)
*H01L 23/00* (2006.01)

(52) U.S. Cl.
CPC .. *H01L 21/76856* (2013.01); *H01L 21/76802* (2013.01); *H01L 21/76846* (2013.01); *H01L 21/76849* (2013.01); *H01L 21/76877* (2013.01); *H01L 24/03* (2013.01); *H01L 24/05* (2013.01); *H01L 2224/0401* (2013.01); *H01L 2224/05025* (2013.01)

(58) Field of Classification Search
None
See application file for complete search history.

(56) References Cited

U.S. PATENT DOCUMENTS

2018/0211872 A1 * 7/2018 Wu .................. H01L 21/28568

* cited by examiner

*Primary Examiner* — Zandra V Smith
*Assistant Examiner* — Lawrence C Tynes, Jr.
(74) *Attorney, Agent, or Firm* — Slater Matsil, LLP

(57) ABSTRACT

A method of forming a semiconductor device includes patterning a dielectric layer to form a groove and depositing a plurality of conductive layers over the dielectric layer and in the groove. The first conductive layer is a liner layer, the second conductive layer is a metal film, and the third conductive layer is a capping layer. The first conductive layer is treated with a hydrogen plasma treatment to remove impurities. The first conductive layer is also treated with a hydrogen soak treatment to remove microvoids. The third conductive layer is treated with an ammonia plasma treatment to remove impurities. The third conductive layer is also treated with a hydrogen plasma treatment to remove additional impurities. The third conductive layer is also treated with a hydrogen soak treatment to remove microvoids.

20 Claims, 33 Drawing Sheets

METHOD OF FORMING AN INTERCONNECT IN A SEMICONDUCTOR DEVICE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
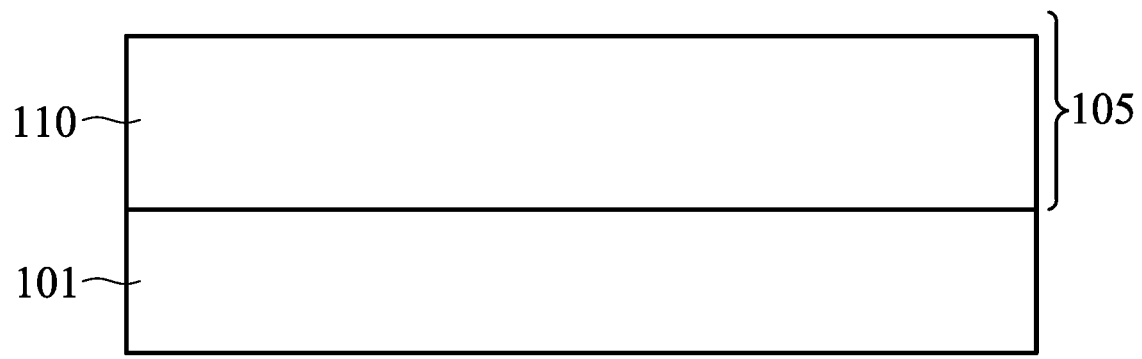
FIGS. 1-3, 4A, 4B, 5A, 5B, 6A, 6B and 7-10 illustrate various process steps in the fabrication of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The manufacture of semiconductor devices involves thousands of steps, including forming semiconductor components in and over a semiconductor substrate. Because these devices have a two-dimensional pattern on a surface of the semiconductor substrate, a three-dimensional network of metal wiring is necessary to direct the signals throughout the semiconductor device and ultimately to the external electrical connectors of the semiconductor package. A large portion of this metal wiring comprises multiple layers of conductive lines separated by dielectric layers and having conductive vias electrically coupling conductive lines of one layer to conductive lines of other layers.

Throughout the manufacture of the semiconductor device, annealing treatments are used to, repair damaged regions, improve device speed and RC delay. The annealing treatments may be used simultaneously or in conjunction with high pressure treatments. Sometimes these treatments may cause some voids to move through the layers and combine with other voids. In some cases, these treatments may damage certain features in a semiconductor device or increase the diffusion of materials from one feature to a neighboring feature. The diffusion of metals into dielectric layers, for example, may decrease the efficiency and reliability of the integrated circuit of the semiconductor device. For these and other reasons, the design of the semiconductor fabrication process often includes limiting the number and degree of the annealing treatments. As such, the overall thermal budget is controlled to minimize the negative consequences of thermal steps, such as annealing treatments. As discussed below, one method of mitigating the thermal budget is to increase the pressure during an annealing treatment. For example, a high pressure anneal (HPA) may achieve similar benefits of an annealing treatment while utilizing a lower temperature than otherwise.

After formation of certain front end of the line (FEOL) semiconductor features along the semiconductor substrate, such as transistors, metallization layers are deposited to form the scaffold of the integrated circuit that electrically couples, or interconnects, the active semiconductor devices to one another. In addition, redistribution layers formed over the metallization layers will route the integrated circuit to external locations. Further, other interconnects may be formed during the packaging of a semiconductor device in order to electrically couple partially packaged semiconductor devices to one another. The following discussion may apply to any of these forms of metallization and wiring regions.

To form the metallization layers, an initial interlayer dielectric may be blanket deposited over the FEOL semiconductor features. The initial interlayer dielectric, or any dielectric or insulating layer discussed below, may comprise one layer or multiple layers of dielectric material. Various locations of the initial interlayer dielectric are then etched to form contact holes that expose, for example, gate electrodes and source/drain regions of the semiconductor substrate. Those contact holes are later filled with metal to form contact plugs that extend from those features to the top surface of the initial interlayer dielectric. Essentially, at this point the wiring layers may be formed.

A first wiring layer 105 (assembled starting in FIG. 1 and onward) may be formed directly over the initial interlayer dielectric. In other cases, one or more wiring layers may be formed over the initial interlayer dielectric, and the first wiring layer 105 may be formed over those one or more wiring layers. The first wiring layer 105 may be formed by depositing a sacrificial material over the initial interlayer dielectric, patterning the sacrificial layer to etch wiring trenches, filling the wiring trenches with metal to form conductive lines, removing the sacrificial layer, and depositing a first insulating layer 110 around the first metal lines.

In other cases and as described in more detail below, the first wiring layer 105 may be formed using a damascene or a dual damascene process. The following discussion involves forming the first wiring layer 105 using a damascene process; however, a person of ordinary skill in the art could follow this disclosure and know how to form the metal wiring using the above-described method or a dual damascene process.

Referring to FIG. 1 for the formation of the first wiring layer 105, for the sake of convenience, the initial interlayer dielectric, the contact plugs, the active semiconductor device features, overlying etch stop layer(s), all other previously formed components of the semiconductor device, and the semiconductor substrate will collectively be referred to as a substrate 101. After formation of those features, a first wiring layer 105 may be formed over the substrate 101. In some embodiments, the first wiring layer 105 is formed over one or more previously formed wiring layers, which may have been formed by any of the below-described processes or otherwise and therefore included as part of the substrate 101. The first wiring layer 105 comprises a first insulating layer 110 and a first conductive line 120 (shown in later figures), wherein the first insulating layer 110 may comprise dielectric material and the first conductive line 120 may comprise conductive material.

The first insulating layer 110 may be blanket deposited over the substrate 101. The first insulating layer 110 may be an interlayer dielectric (ILD) layer or an intermetal dielectric (IMD) layer. The first insulating layer 110 may be deposited by any suitable method, such as chemical vapor deposition (CVD), plasma-enhanced CVD (PECVD), or spin-on coating. The material of the first insulating layer 110 may comprise any suitable insulating material, such as silicon nitride, silicon oxynitride, silicon oxide, or the like. The material of the first insulating layer 110 may also include another nitride, another oxide, or any suitable dielectric, such as an epoxy, a resin, a moldable polymer, such as a polyimide, and the like.

Figure 2:
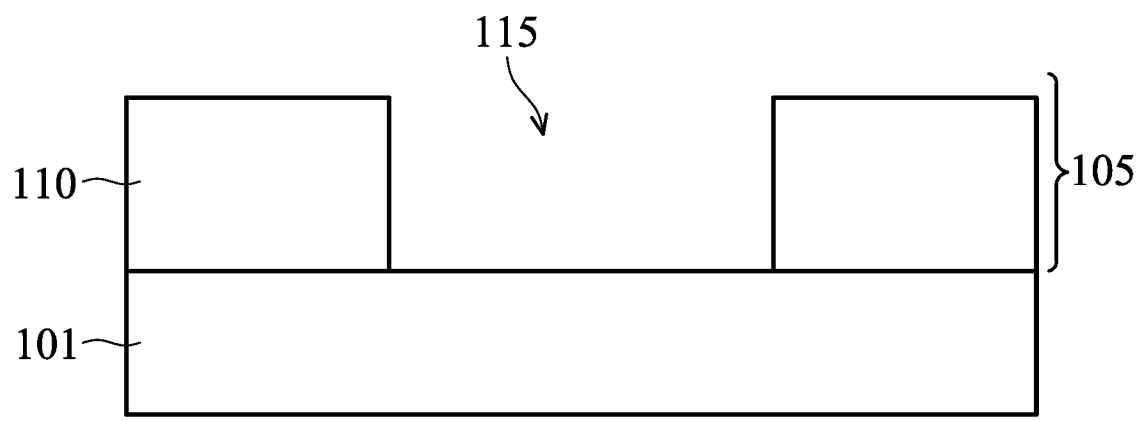

Referring to FIG. 2, trenches 115 may be formed in the first insulating layer 110. For example, the trenches 115 may be patterned using one or more photolithography processes (not specifically depicted in the figures), including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern trenches 115. Alternatively, a photoresist (not shown) is formed and patterned on the first insulating layer 110. The photoresist may be formed by spin coating or the like and may be exposed to light for patterning. The pattern of the photoresist corresponds to a pattern for the first conductive line 120. The patterning forms openings through the photoresist to expose the first insulating layer 110. The exposed portions of the first insulating layer 110 may then be removed by etching or any suitable process, thereby exposing the substrate 101. The photoresist may be removed by any acceptable ashing or stripping process, such as using an oxygen plasma or the like.

Figure 3:
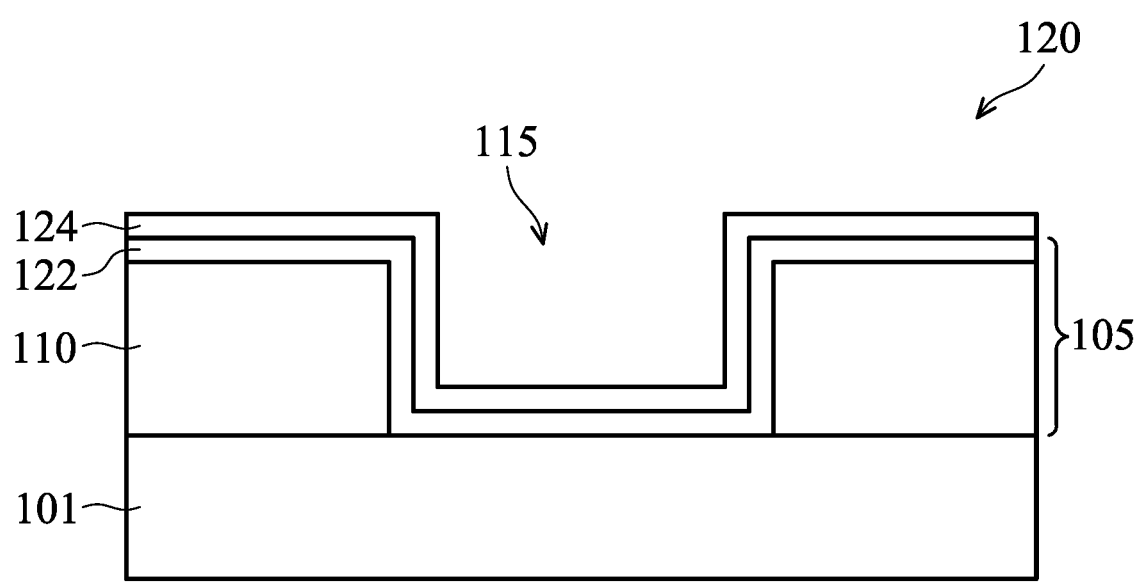

As shown starting in FIG. 3 and onward, the trench may be filled with a plurality of layers to form the first conductive line 120. This plurality of layers may include one or more barrier layers 122 and 124, a liner layer 130, the metal film 140, and a capping layer 150. In some embodiments, a seed layer (not shown) may be deposited in the wiring trenches. In such embodiments, the seed layer is a metal layer, which may be a single layer or a composite layer including a plurality of sub-layers formed of different materials, which may include, for example, titanium and/or copper, using techniques like physical vapor deposition (PVD), chemical vapor deposition (CVD), atomic layer deposition (ALD), or the like.

An advantageous feature of the barrier layer(s) 122/124 is to prevent the metals from the wiring—such as from the metal film 140—from diffusing into the surrounding dielectric layers. Metals diffusing into dielectric layers could potentially form conductive paths through those dielectric layers, thereby causing short circuits during use of the integrated circuit or otherwise reducing the performance and reliability of the integrated circuit.

Referring to FIG. 3, the first conductive line 120 may comprise a first barrier layer 122 and/or a second barrier layer 124. The first barrier layer 122 may be deposited over the first insulating layer 110 and the substrate and into the trench 115 using ALD, PVD, CVD, or any suitable deposition technique. In an embodiment, the first barrier layer 122 is deposited using ALD. The first barrier layer 122 may comprise tantalum, titanium, tantalum nitride (TaN), titanium nitride (TiN), or the like. The second barrier layer 124 may be deposited over the first barrier layer 122 and into the trench 115 using any of the techniques identified with respect to the first barrier layer 122. In an embodiment, the second barrier layer 124 is deposited using PVD. The second barrier layer 124 may also comprise tantalum, titanium, TaN, TiN, or the like.

In some embodiments, the first barrier layer 122 and the second barrier layer 124 are deposited using different techniques or the same technique. In addition, the first barrier layer 122 may be nitrogen-rich—that is, the first barrier layer 122 may have a higher atomic percentage of nitrogen than metal (such as tantalum). Further, the second barrier layer 124 may be metal-rich (or tantalum-rich)—that is, the second barrier layer 124 may have a higher atomic percentage of metal (such as tantalum) than nitrogen.

The first barrier layer 122 may have a thickness of between about 3 Angstroms and about 20 Angstroms. The second barrier layer 124 may have a thickness of between about 3 Angstroms and about 20 Angstroms. In some embodiments, the combined thickness of the first and second barrier layers 122 and 124 may be about 10 Angstroms. In other embodiments, the combined thickness may be less than 10 Angstroms. In embodiments in which there is only a first barrier layer 122 and no second barrier layer 124, the thickness of the first barrier layer 122 may be about 10 Angstroms or, alternatively, less than 10 Angstroms.

An advantageous feature of the liner layer 130 is to improve adherence of the barrier layers 122 and 124 to the metal film 140 (discussed in detail later). Poor adherence could increase the formation of voids at the interface of those layers during manufacture or during use of the semiconductor device. Such voids would weaken the overall conductivity of the first conductive line 120 and, therefore, potentially decrease the effectiveness, reliability, and longevity of the semiconductor package.

Figure 4A:
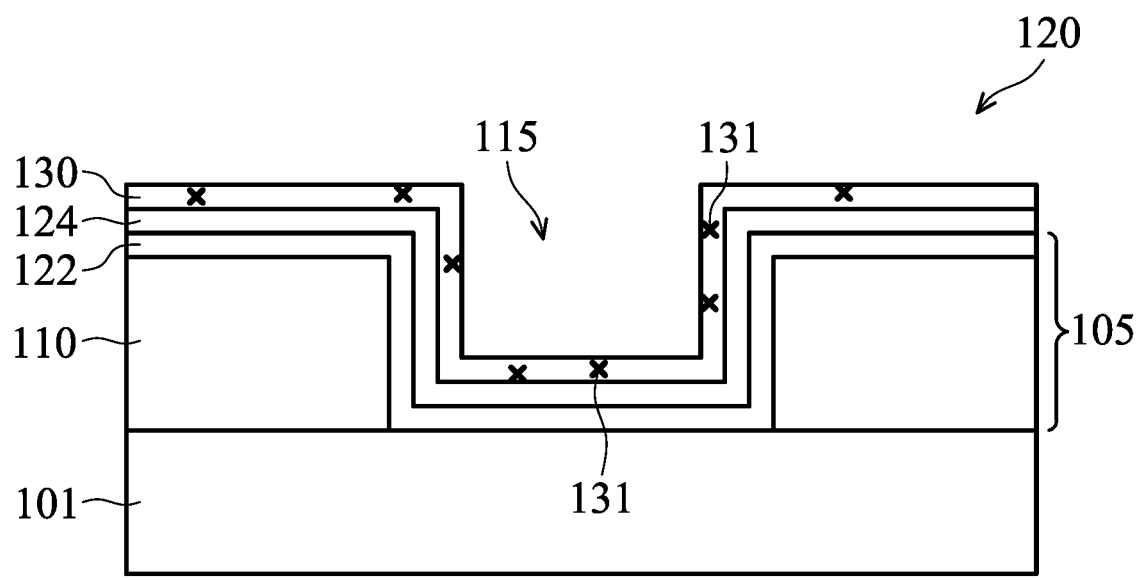

Referring to FIG. 4A, the liner layer 130 may be deposited over the second barrier layer 124 (or the topmost barrier layer) and into the trench 115 using ALD, PVD, CVD, or any suitable deposition technique. In an embodiment, the liner layer 130 is deposited using CVD. The liner layer 130 may comprise cobalt, ruthenium, molybdenum, indium, or the like. The liner layer 130 may be deposited using any of the techniques identified with respect to the barrier layers 122 and 124.

In an embodiment, the liner layer 130 comprises cobalt and is deposited using CVD. The deposition may use a cobalt precursor that is a molecule that further comprises atoms of carbon, oxygen, and hydrogen. As a person of ordinary skill in the art would understand, the deposition process mostly deposits the cobalt onto a top surface of the second barrier layer 124 while the other atoms (e.g., the carbon, oxygen, and hydrogen) are mostly removed from the precursor molecule before or shortly after landing on the surface of the semiconductor device and ultimately removed from the system. However, a person of ordinary skill in the art would also understand that some of the oxygen and carbon atoms will be deposited with the liner layer 130 as liner impurities 131 and, therefore, may not be immediately removed from the system during this deposition process. The liner layer 130 may have a thickness of between about 3 Angstroms and about 30 Angstroms.

Figure 4B:
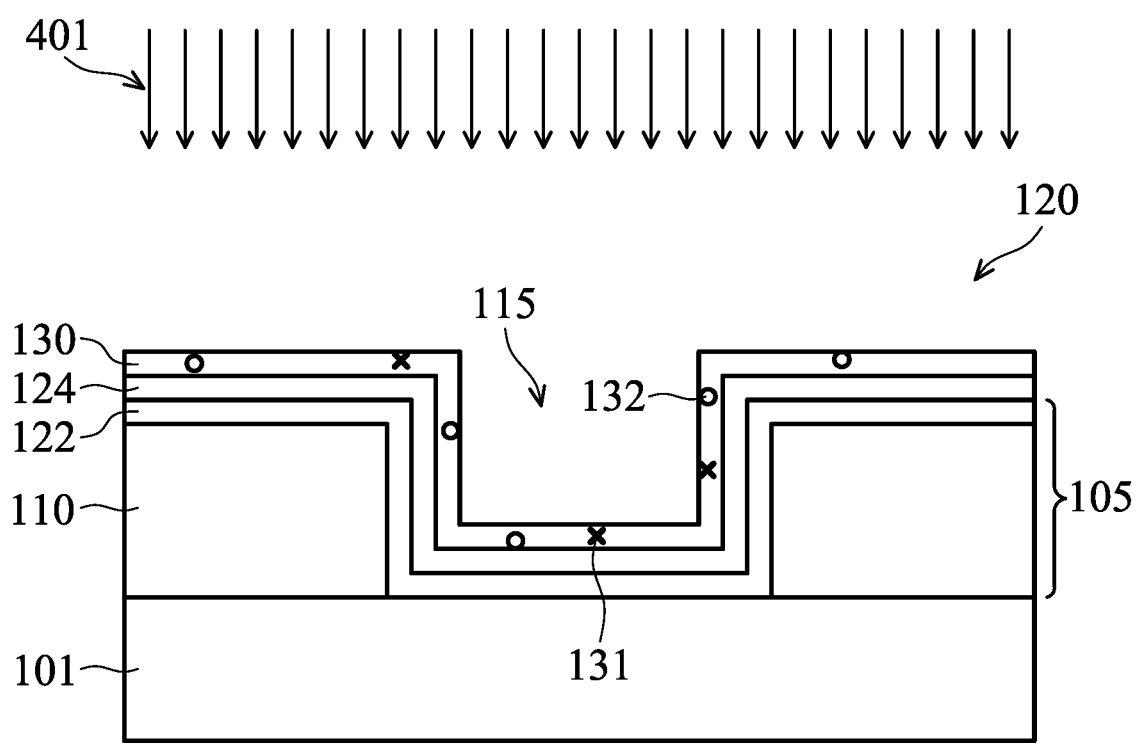

Referring to FIG. 4B, a planarization process may be performed on the first barrier layer 122, the second barrier layer 124, and the liner layer 130. The planarization process may also planarize portions of the first insulating layer 110. Top surfaces of the first insulating layer 110, the first barrier layer 122, the second barrier layer 124, and the liner layer 130 will typically be coplanar after the planarization process. The planarization process may be, for example, a chemical-mechanical polish (CMP), a grinding process, or the like. Alternatively, this CMP process may be postponed to a later step, such as after deposition of the metal film 140. In other alternative embodiments, a CMP step may occur before or after each of the depositions of the first insulating layer 110, the first barrier layer 122, and/or the second barrier layer 124.

Referring to FIG. 4B, the liner layer 130 may be treated with hydrogen ($H_2$) plasma in a hydrogen plasma treatment 401. The hydrogen plasma treatment 401 removes carbon and oxygen from the deposited liner layer 130 by reacting with carbon and oxygen atoms and subgroups containing carbon and oxygen to form volatile molecules that will more readily be removed from the system. In particular, hydrogen ions and electrons will bombard the liner layer 130 and reach carbon and oxygen (i.e., the liner impurities 131) at a surface of the liner layer 130 as well as within the depth of the liner layer 130. When the volatile molecules leave the liner layer 130, they may leave behind liner microvoids 132 in the liner layer 13o. The hydrogen plasma treatment 401 may be performed at between about 100 and about 400° C. and at between about 1 mTorr and about 10 mTorr, such as about 3-5 mTorr. The flowrate of hydrogen plasma may be between about 1000 sccm (standard cubic centimeters per minute) and 12000 sccm. The hydrogen plasma treatment 401 may last between about 5 seconds and about 5 minutes, or about 24 seconds.

In an embodiment, the liner layer 130 may be deposited in multiple iterations. For example, after a first cycle of deposition, a first cycle of the hydrogen plasma treatment 401 may be performed as described above. Following the first cycle of the hydrogen plasma treatment 401, a second cycle of deposition may be performed. That second cycle of deposition may be followed by a second cycle of the hydrogen plasma treatment 401, and so on. The complete deposition of the liner layer 130 may be completed in less than 10 iterations of each deposition cycle, or in about 4 or 5 iterations of each deposition cycle in total.

Figure 5A:
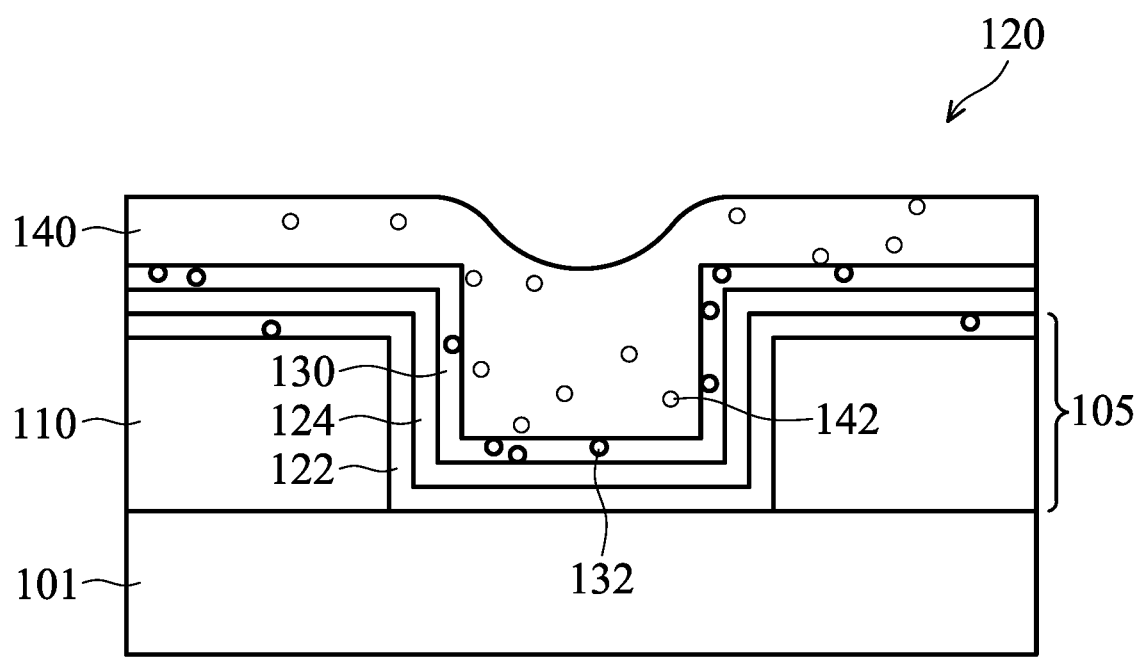

Referring to FIG. 5A, to form the metal film 140, a conductive material is formed over the liner layer 130 and into the trench 115 using plating, such as electroplating or electroless plating, PVD, CVD, or the like. The conductive material of the metal film 140 may comprise a metal, like copper, a copper alloy, silver, gold, cobalt, titanium, tungsten, aluminum, nickel, or the like. In an embodiment, the conductive material of the metal film 140 comprises copper. A person of ordinary skill would understand that the deposition process of the conductive material is rarely perfect. Consequently, wiring microvoids 142 may be formed in the metal film 140.

Figure 5B:
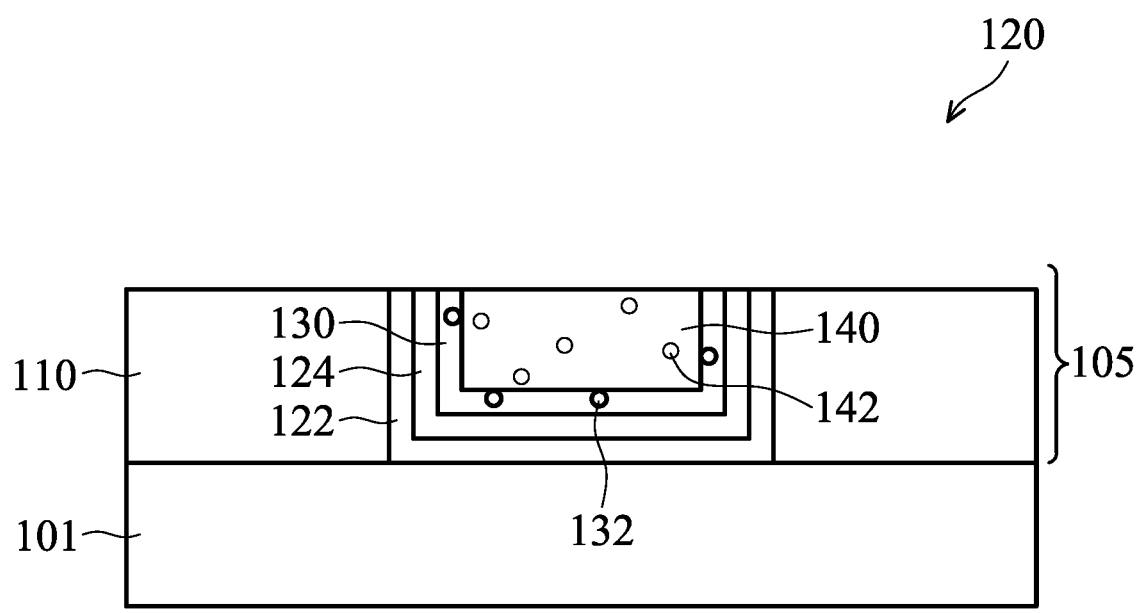

Referring to FIG. 5B, a planarization process is performed on the metal film 140. The planarization process may also planarize portions of the first barrier layer 122, the second barrier layer 124, the liner layer 130, and/or the first insulating layer 110. Top surfaces of the metal film 140, the first insulating layer 110, the first barrier layer 122, the second barrier layer 124, and the liner layer 130 will typically be coplanar after the planarization process. The planarization process may be, for example, a CMP process, or the like.

An advantageous feature of the capping layer 150 is to prevent or inhibit oxidation of the underlying layers, such as the metal film 140. Oxidation of the metal film 140 or any of the other metal-containing layers may reduce the conductivity of those layers. Because the metal film 140 comprises the majority of the conductive portion (i.e., the wiring) of the first conductive line 120, it is preferable to minimize oxidation of the metal film 140.

Figure 6A:
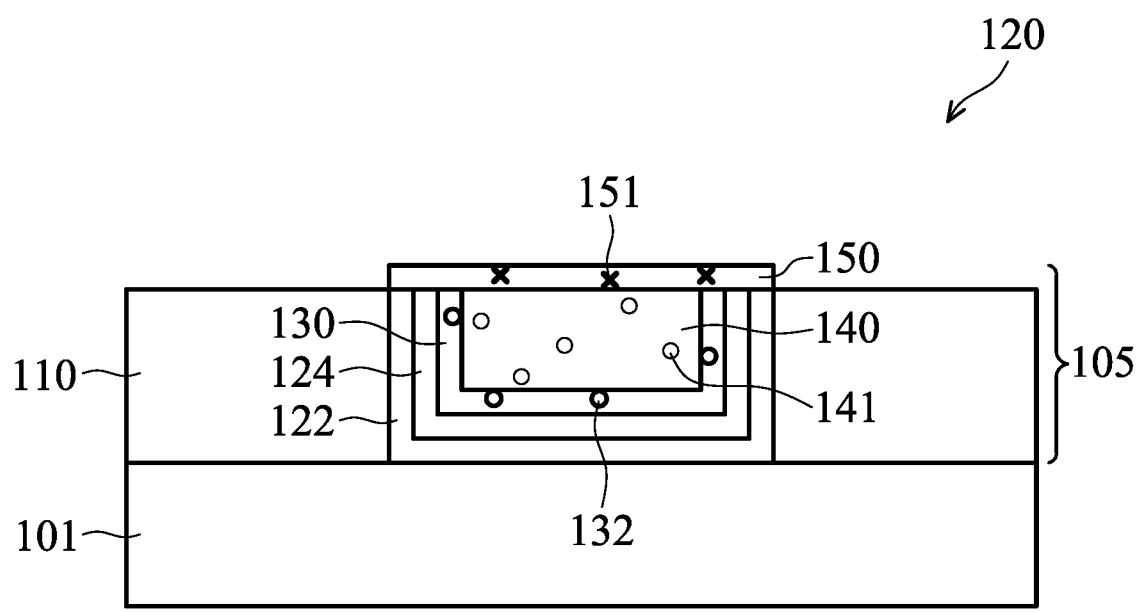

Referring to FIG. 6A, the capping layer 150 may be deposited over the first insulating layer 110, the first barrier layer 122, the second barrier layer 124, the liner layer 130, and the metal film 140 using electroplating, ALD, PVD, CVD, or any suitable deposition technique. In an embodiment, the capping layer 150 is deposited using CVD. For example, excess portions of the capping layer 150 may be removed with any suitable method, such as using lithography. As such, a photoresist (not shown) may be formed over the capping layer 150. The photoresist may be patterned to expose portions of the capping layer 150 that are not directly over the first conductive line 120 (i.e., the barrier layers 122 and 124, the liner layer 130, the metal film 140). In an embodiment, the capping layer 150 is selectively deposited over the metal film 140. In addition, portions of the capping layer 150 may also be deposited over one or more of the liner layer 130, the second barrier layer 124, and the first barrier layer 122. The capping layer 150 may comprise cobalt, or the like. The capping layer 150 may be deposited using any of the techniques identified with respect to the barrier layers 122 and 124 or any of the other layers, such as the liner layer 130.

In an embodiment, the capping layer 150 comprises cobalt and is deposited using CVD. Similar to the liner layer 130, the deposition may use a cobalt precursor that is a molecule that further comprises atoms of carbon, oxygen, and hydrogen. As a person of ordinary skill in the art would understand, the deposition process mostly deposits the cobalt onto a top surface of the second barrier layer 124 while the other atoms (e.g., the carbon, oxygen, and hydrogen) are mostly removed from the precursor molecule before or shortly after landing on the surface of the semiconductor device and ultimately removed from the system. However, a person of ordinary skill in the art would also understand that some of the oxygen and carbon atoms will be deposited with the capping layer 150 as capping impurities 151 and, therefore, may not be immediately removed from the system during this deposition process. The capping layer 150 may have a thickness of between about 5 Angstroms and about 50 Angstroms.

Figure 6B:
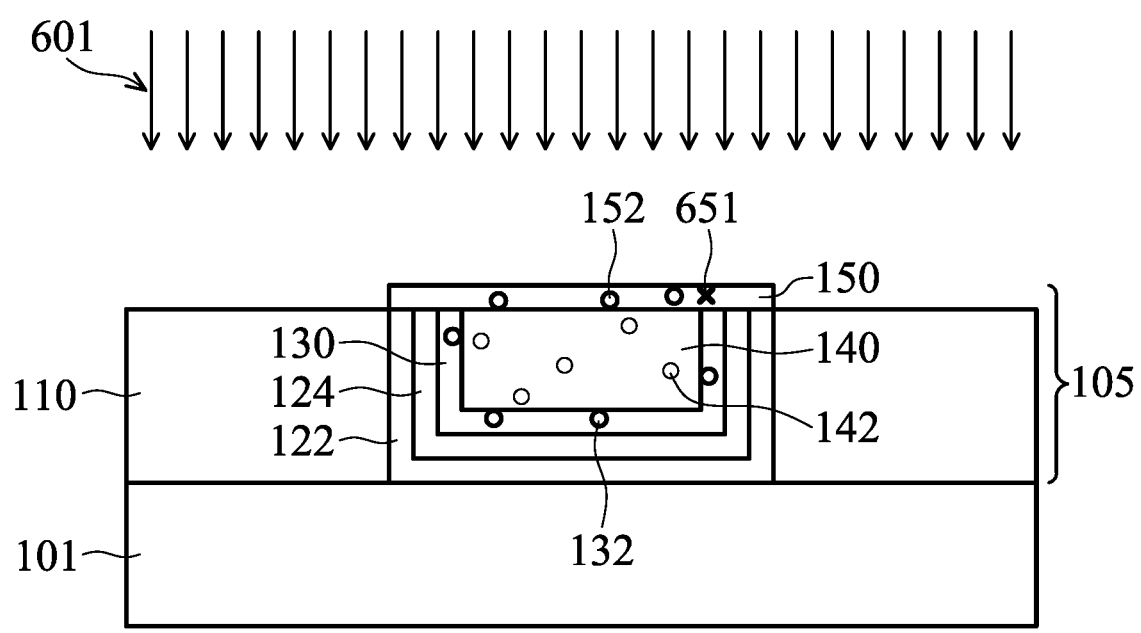

Referring to FIG. 6B, the capping layer 150 may be treated with ammonia ($NH_3$) plasma in an ammonia plasma treatment 601. The ammonia plasma treatment 601 removes carbon and oxygen from the deposited capping layer 150 by reacting with carbon and oxygen atoms and subgroups containing carbon and oxygen to form volatile molecules that will more readily be removed from the system. In particular, ions from ammonia molecules such as, azanide ions ($NH_2^-$) and hydrogen ions ($H^+$) will bombard the capping layer 150 and reach carbon and oxygen impurities (i.e., the capping impurities 151) at a surface of the capping layer 150 as well as within the depth of the capping layer 150. When the volatile molecules leave the capping layer 150, they may leave behind capping microvoids 152. A person of ordinary skill in the art may also appreciate that the ammonia plasma treatment 601 may also leave some amount of nitrogen impurities 651 in the capping layer 150. The ammonia plasma treatment 601 may be performed at between about 100 and about 400° C. and at between about 1 mTorr and about 10 mTorr, such as about 3-5 mTorr. The flowrate of ammonia plasma may be between about 100 sccm and 10000 sccm. The ammonia plasma treatment 601 may last between about 2 seconds and about 5 minutes, or about 5 seconds. Alternatively, the capping layer 150 may be treated with a hydrogen plasma treatment as described above with respect to the liner layer 130.

In an embodiment, the capping layer 150 may be deposited in multiple iterations. For example, after a first cycle of deposition, a first cycle of the ammonia plasma treatment 601 may be performed as described above. Following the first cycle of the ammonia plasma treatment 601, a second cycle of deposition may be performed. That second cycle of deposition may be followed by a second cycle of the ammonia plasma treatment 601, and so on. The complete deposition of the capping layer 150 may be completed in less than 10 iterations of each deposition cycle, or in about 4 or 5 iterations of each deposition cycle in total. Alternatively, this deposition process may be conducted with cycles of a hydrogen plasma treatment instead or with a mixture of cycles of an ammonia plasma treatment 601 for some iterations and cycles of a hydrogen plasma treatment for other iterations, such as simultaneously or in an alternating fashion. In an alternative embodiment, the patterning may be performed after the ammonia plasma treatment 601.

Figure 7:
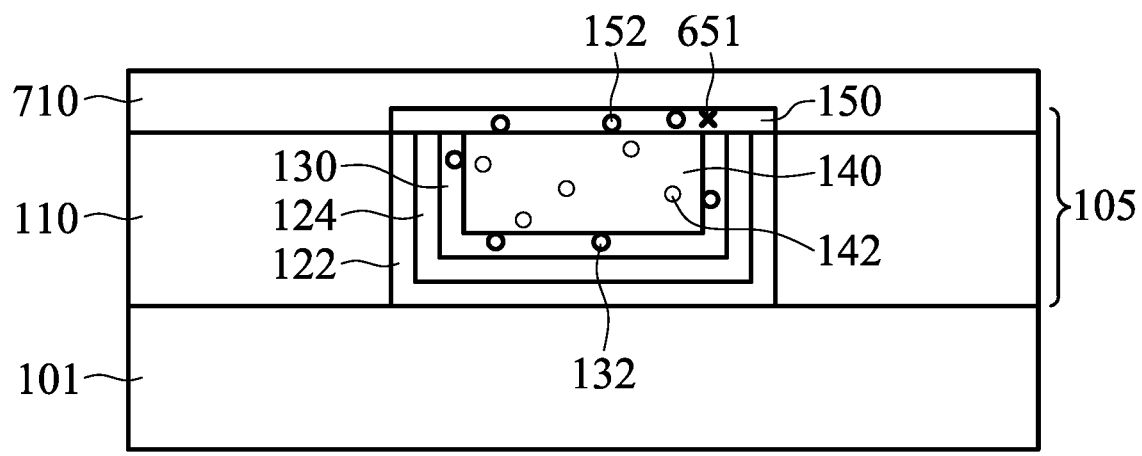

Referring to FIG. 7, an etch stop layer 710 may be formed over the first wiring layer 105. The etch stop layer 710 may comprise one or more layers, including aluminum oxide (e.g., $Al_2O_3$), silicon nitride, silicon oxide, silicon oxycarbide ($SiO_xC_y$), or the like. In an embodiment, the etch stop layer 710 comprises two aluminum oxide layers with a silicon oxycarbide layer interposed there between.

Figure 8:
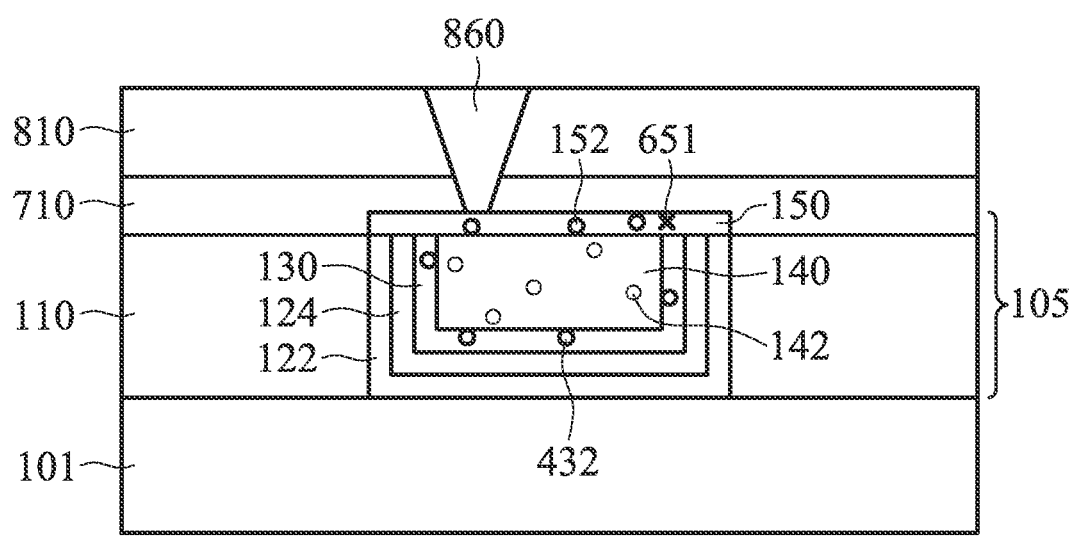

Referring to FIG. 8, a second insulating layer 810 may be formed over the etch stop layer 710 in a similar or different manner as the first insulating layer 110. In addition, a via 860 may be formed through the second insulating layer 810 in a similar or different manner as the metal-containing layers of the first conductive line 120. The via 860 may comprise a third barrier layer (not specifically depicted), a fourth barrier layer (not specifically depicted), a second liner layer (not specifically depicted), and a second metal film (not specifically depicted), wherein each of these features may be formed in a similar or different manner as its analog described above in regard to the first conductive line 120. The via 860 may further comprise a second capping layer (not specifically depicted) deposited over the second bulk film. During formation of the via 860, it may undergo some or all of the above-described processes and treatments, such as planarization, patterning, hydrogen plasma treatment, and/or ammonia plasma treatment.

Figure 9:
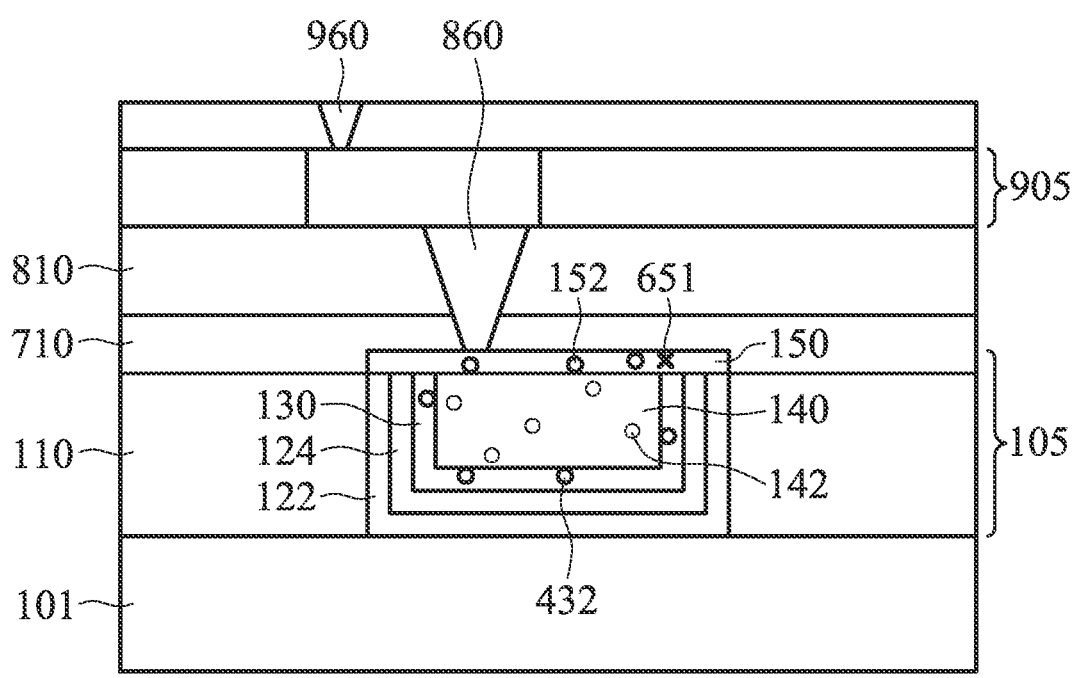

Referring to FIG. 9, one or more additional wiring layers 905 (comprising conductive lines) and vias may be formed over the first wiring layer 105 and the via 860. Collectively, the totality of wiring layers may form the metallization in the back end of line (BEOL) portion of the semiconductor device. This metallization region may contain any number of wiring layers, such as only seven layers to as much as twelve or more wiring layers.

Figure 10:
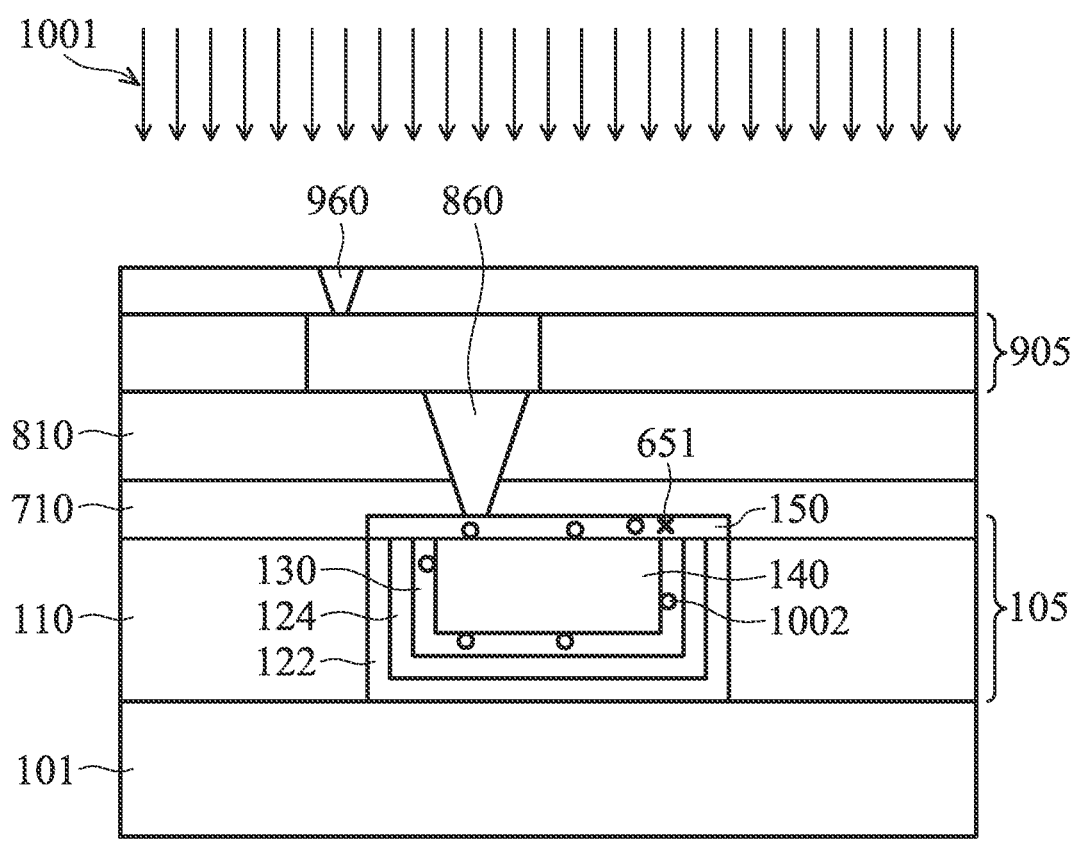

Referring to FIG. 10, following completion of forming several or all of the wiring layers, a high pressure anneal (HPA) 1001 may be performed on the semiconductor device. It may be advantageous to perform the HPA 1001 during later stages because any thermal steps following the HPA 1001 may degrade its benefits of fixing defects with ubiquitous hydrogen. In some embodiments, a passivation layer (not shown in the figures) may be formed over the wiring layers prior to performing the HPA 1001. The HPA 1001 is useful for repairing some of the deformities in various layers and for removing some of the impurities that may be formed or deposited during the fabrication process.

Specifically, the HPA 1001 drives hydrogen deep through the layers in order to improve and repair portions of the front end of line (FEOL) and back end of line (BEOL) of the semiconductor device. The HPA 1001 may cause a reorientation of deformities in the layers, wherein the wiring microvoids 142 in the metal film 140 (and in other wiring layers) move outward toward the liner microvoids 132 and the capping microvoids 152 to combine and form voids 1002, which may be larger than the wiring microvoids 142, the liner microvoids 132, or capping microvoids 152 individually. The voids 1002 may be located at a surface of the liner layer 130, at a surface of the capping layer 150, within the depths of those layers, and/or in outer regions of the metal film 140 near those other layers. In an embodiment, the HPA 1001 may be performed after formation of additional conductive layers and features over the wiring layers of the semiconductor device.

Before performing the HPA 1001, the semiconductor device is typically transferred to a special processing chamber that is designed to produce the extreme conditions of the HPA 1001. When the semiconductor device is secured inside, the special processing chamber may be pressurized to between about 5 atm and about 25 atm, or to about 20 atm, in a hydrogen or hydrogen-rich atmosphere. The anneal of the HPA 1001 may then be conducted at a temperature reaching between about _300_° C. and about _500_° C., or at about 400° C. The anneal may last between about _10_minutes and about _400_minutes, or about _30_minutes. Subsequently, the special processing chamber is depressurized by removing the hydrogen from the special processing chamber. The depressurization may include replacing some of the hydrogen with an inert gas, such as nitrogen and/or argon, while reducing the ambient pressure to about 1 atm or less.

As discussed previously, annealing treatments, such as the HPA 1001, may cause the previously discussed microvoids to move through the layers and combine with one another to form voids 1002. In embodiments in which the combined thickness of the first and second barrier layers 122 and 124 is about 10 Angstroms or greater, the voids 1002 may have relatively minor effects on the performance of the integrated circuit. The reason for this is that integrated circuits with one or more barrier layers with that combined thickness will also typically have analogously larger metal film regions in the conductive lines. Due to a larger feature size, the voids 1002 in and/or near the barrier layers and liner layer may not be detrimental to the performance and reliability of the integrated circuit.

In embodiments in which the combined thickness of the first and second barrier layers 122 and 124 is less than 10 Angstroms, the larger voids 1002 may have detrimental effects on the performance and reliability of the integrated circuit. The reason for this is that integrated circuits with one or more barrier layers with that lesser combined thickness will also typically have analogously smaller metal film regions in the conductive lines as compared to those integrated circuits with barrier layers having a combined thickness at or greater than 10 Angstroms. Consequently, the HPA 1001 described above may not be required if other treatments are used during the fabrication of the semiconductor device, as described in detail below.

Figure 11:
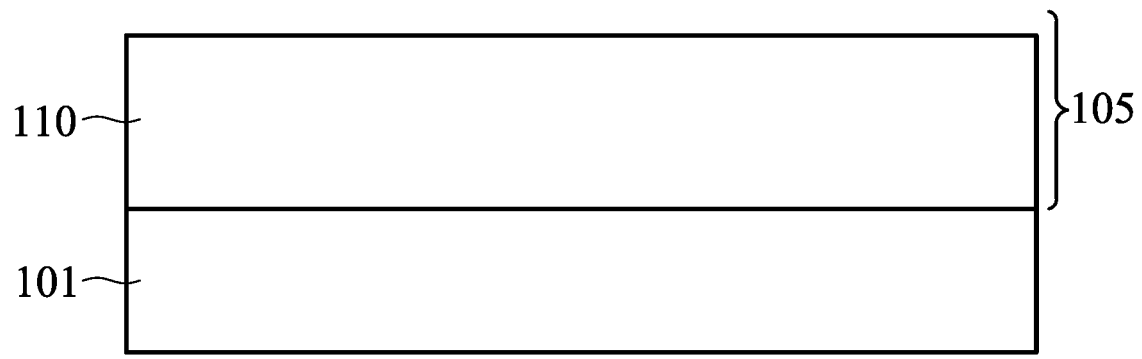
FIGS. 11-13, 14A-14C, 15A, 15B, 16A-16D and 17-19 illustrate various process steps in the fabrication of a semiconductor device, in accordance with some embodiments.
Figure 12:
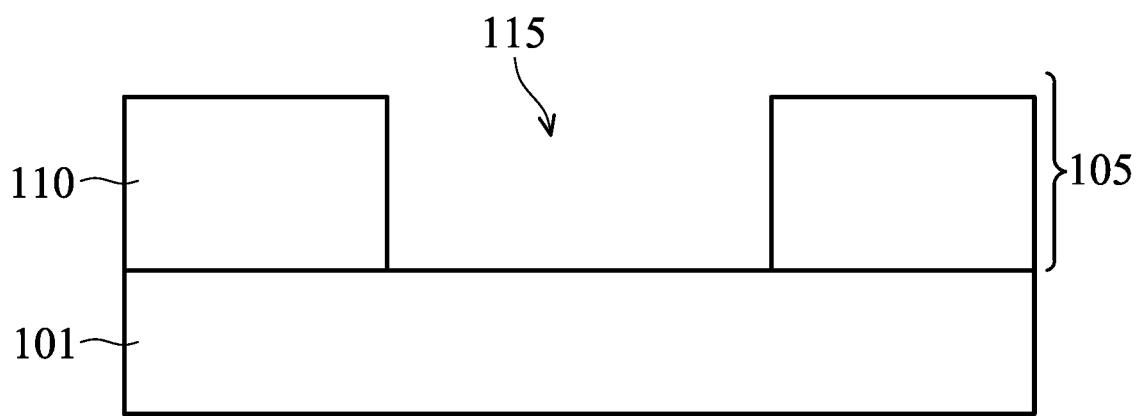
Figure 13:
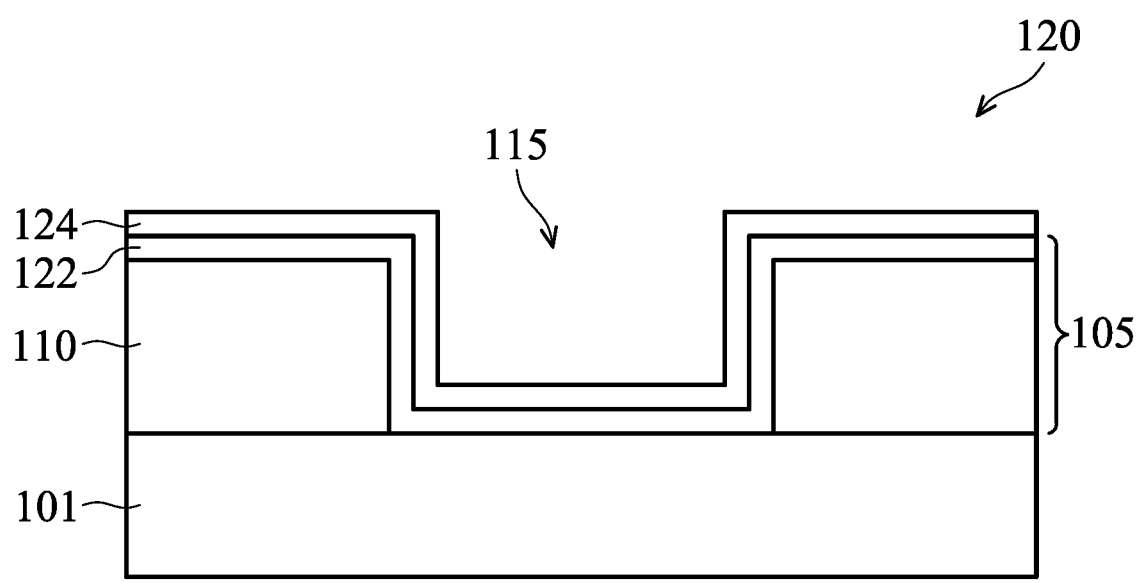
Figure 14A:
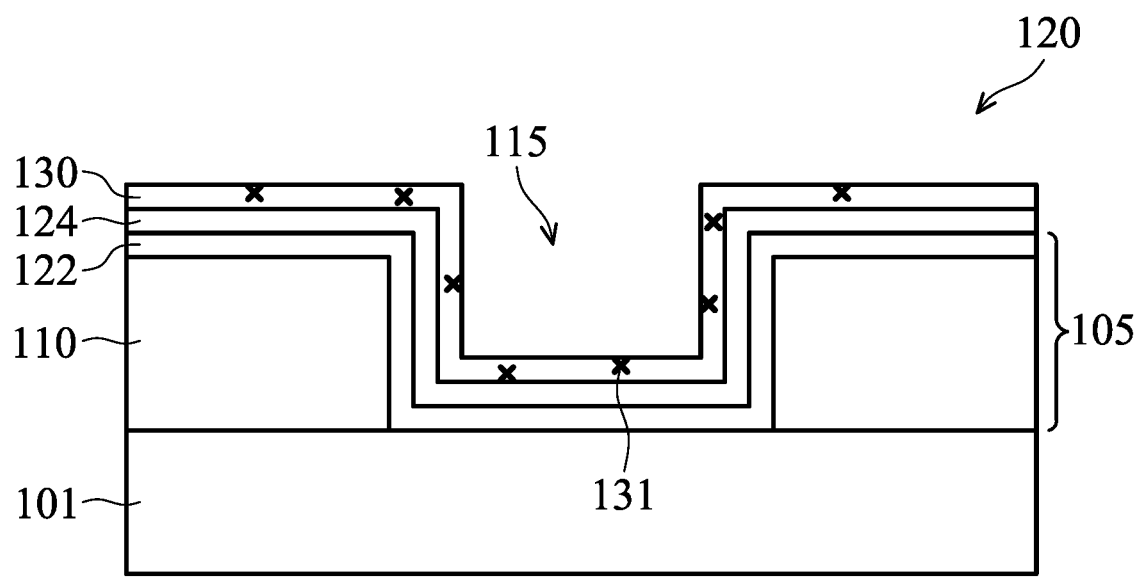
Figure 14B:
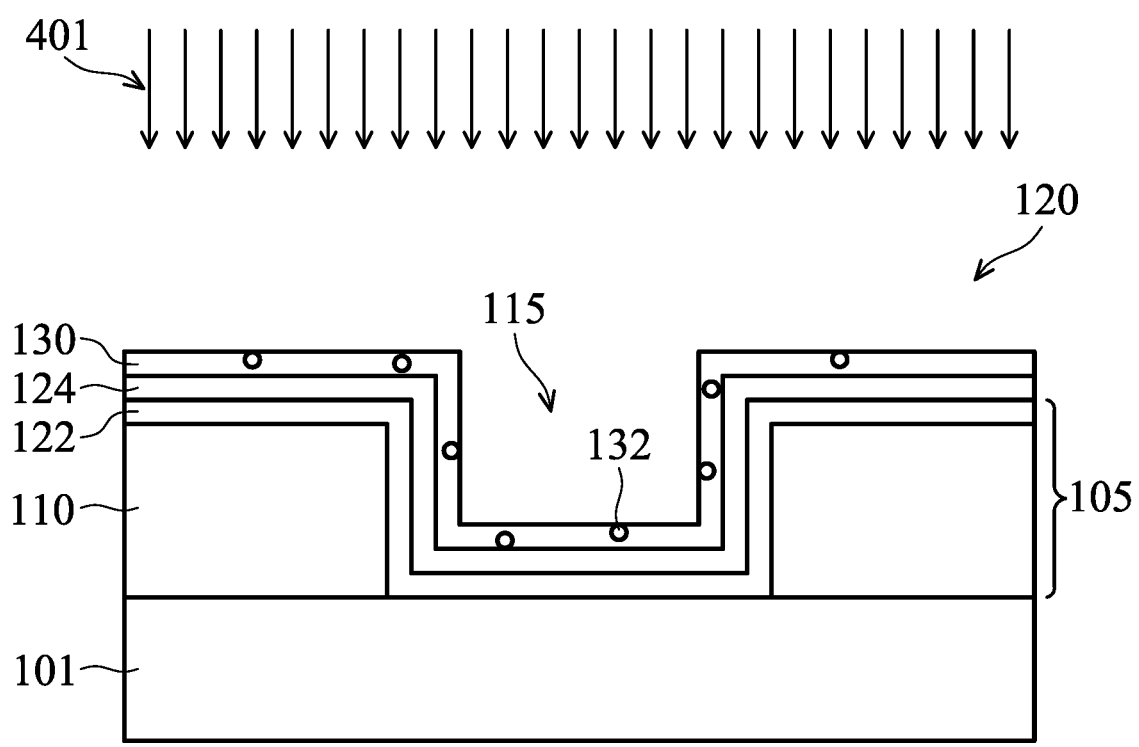

Referring to FIGS. 11-13, in an embodiment, a semiconductor device may be fabricated in a similar way as described above with respect to FIGS. 1-3. Further, referring to FIG. 14A, the liner layer 130 may be deposited as discussed previously with respect to FIG. 4A. Similarly, the deposition of the liner layer 130 may result in liner impurities 131. Referring to FIG. 14B, a hydrogen plasma treatment 401 may be performed on the semiconductor device as described previously with respect to FIG. 4B. Further, the liner layer 130 may be deposited with alternating cycles of depositions and hydrogen plasma treatments 401 as described above.

Figure 14C:
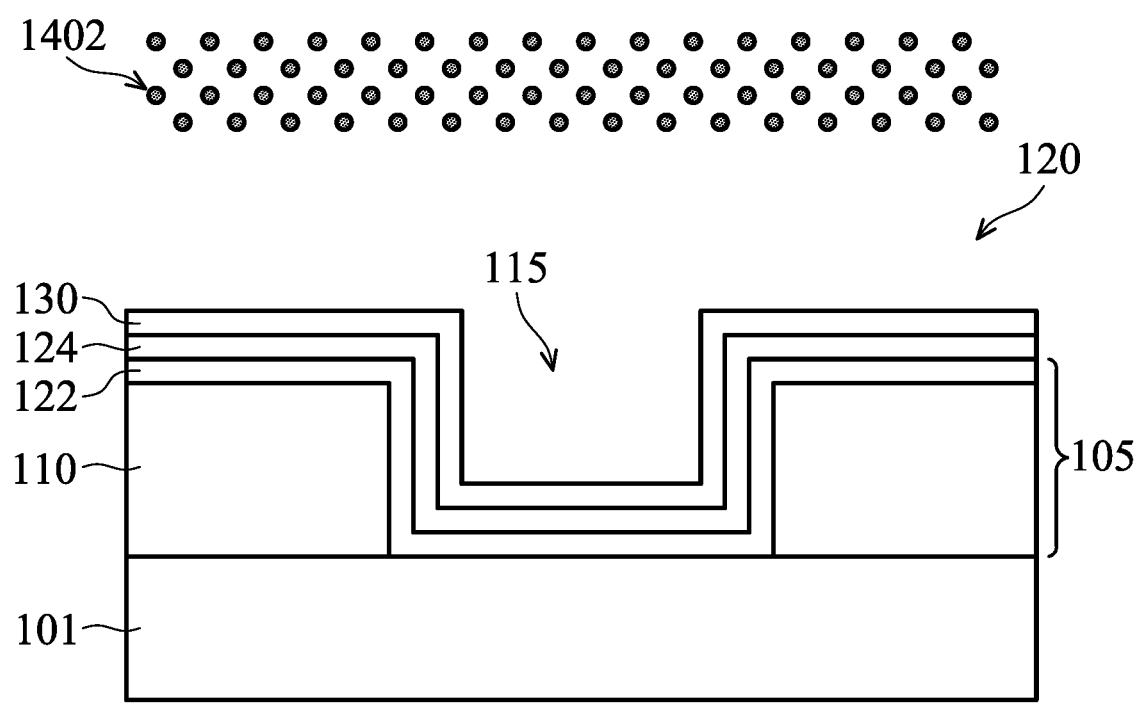

However, referring to FIG. 14C, after the hydrogen plasma treatment 401, the liner layer 130 may be treated with a hydrogen soak treatment 1402 to stabilize the liner layer 130. During the hydrogen soak treatment 1402, hydrogen gas diffuses into the liner layer 130 to repair deformities and reorient the molecules to fill or reduce the liner microvoids 132 in the liner layer 130. The hydrogen soak treatment 1402 may proceed in the same processing chamber that was used for depositing the liner layer 130 and/or for the hydrogen plasma treatment 401. During the hydrogen soak treatment 1402, the semiconductor device is soaked in hydrogen gas at an elevated temperature and pressure. It should be noted that the temperature and pressure of the hydrogen soak treatment 1402 is generally less than those parameters during the HPA 1001 discussed previously. For example, the hydrogen soak treatment 1402 may be performed at between about 100 and about 400° C., such as at about 200° C. In addition, the hydrogen soak treatment 1402 may be performed at between about 10 Torr and about 50 Torr, such as about 35 Torr. The atmosphere in the chamber may contain between about 60% hydrogen and about 100% hydrogen, such as 80% hydrogen wherein the remaining 20% is an inert gas, such as argon.

Figure 15A:
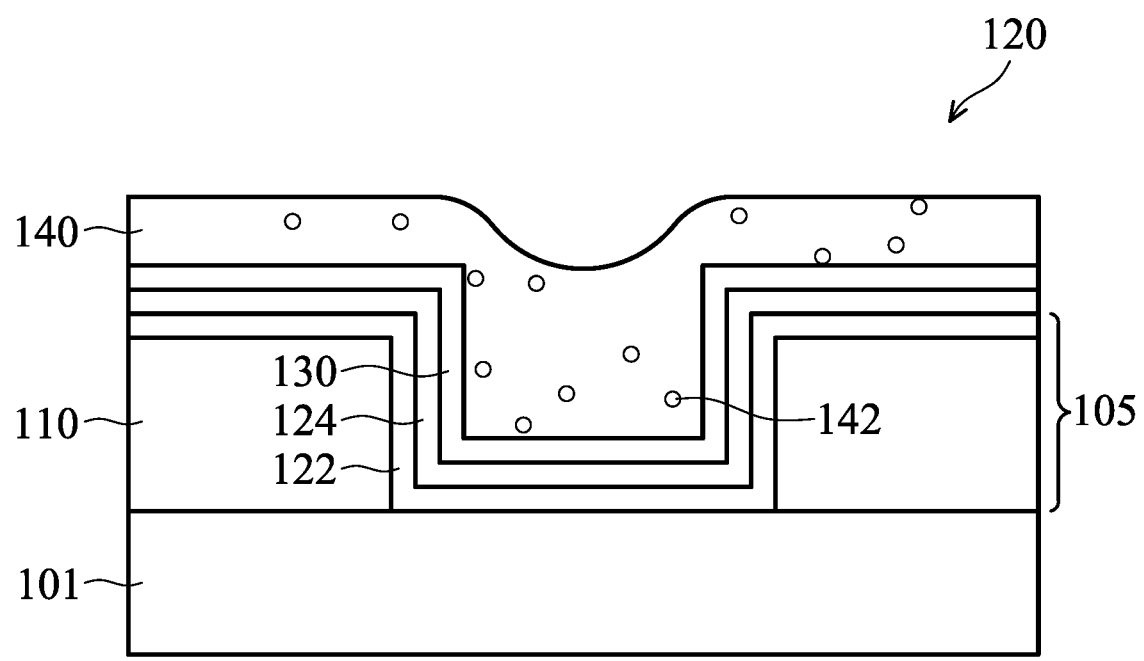
Figure 15B:
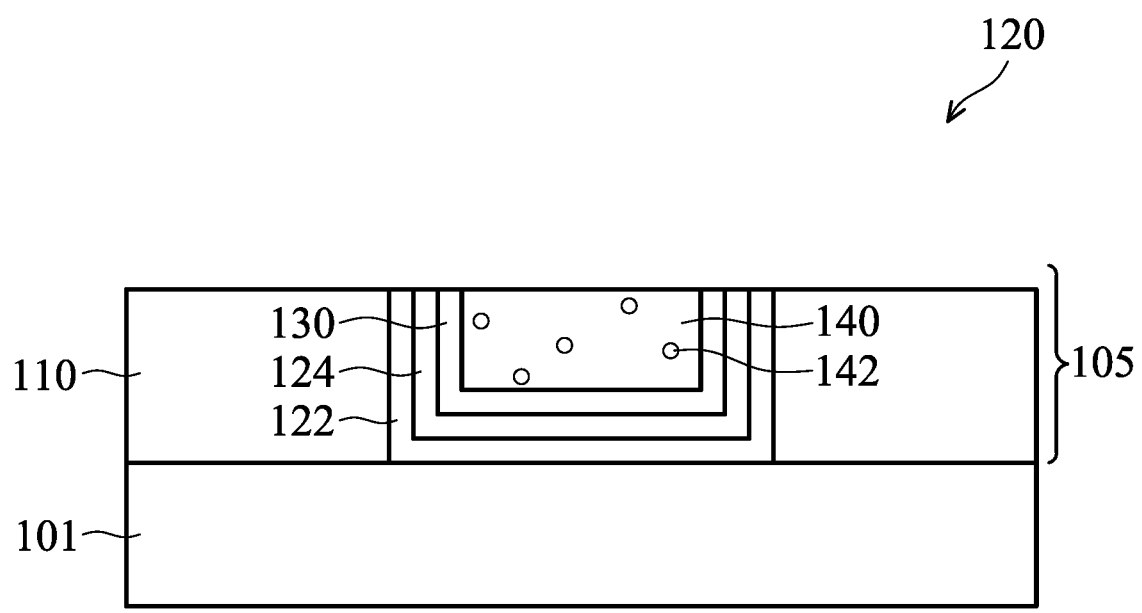

Referring to FIGS. 15A and 15B, the semiconductor device fabrication may continue in a similar way as described above with respect to FIGS. 5A and 5B. In particular, referring to FIG. 15A, the metal film 140 may be deposited as discussed previously with respect to FIG. 5A. Similarly, the deposition of the metal film 140 may result in wiring microvoids 142. Referring to FIG. 15B, the metal film 140 may be planarized as discussed previously with respect to FIG. 5B.

Figure 16A:
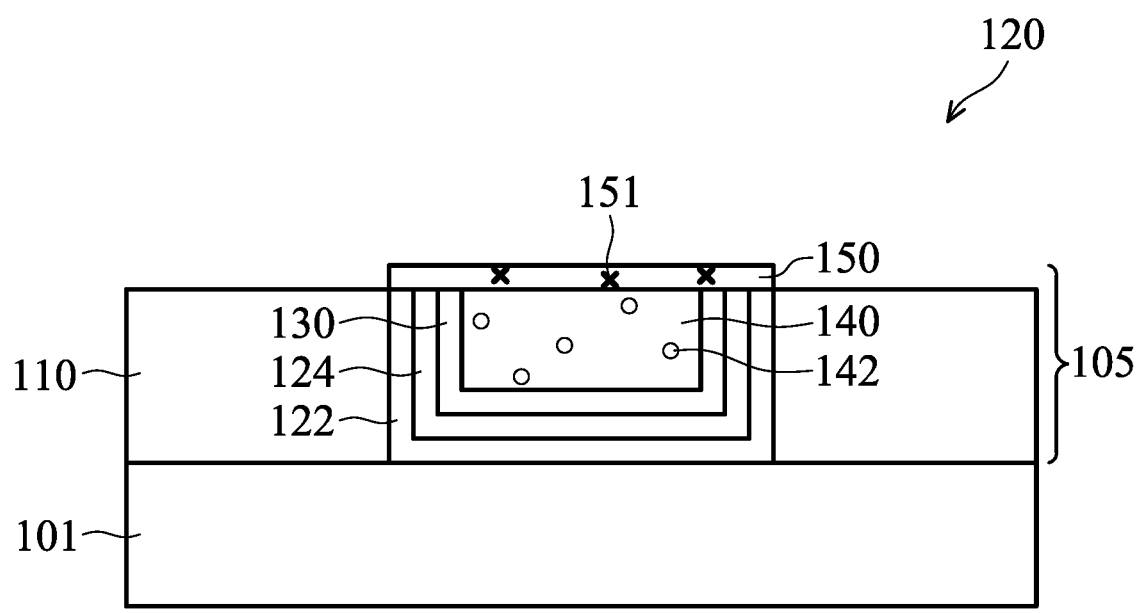
Figure 16B:
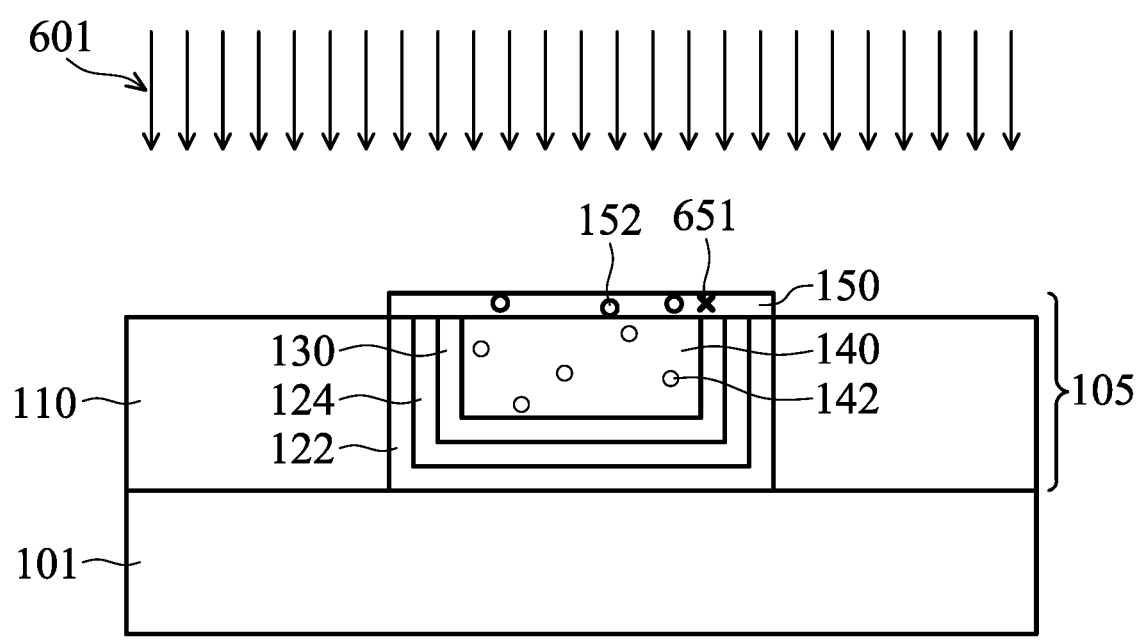

Referring to FIG. 16A, the capping layer 150 may be deposited over the metal film 140 (and additionally over one or more of the liner layer 130, the second barrier layer 124, and the first barrier layer 122) as discussed previously with respect to FIG. 6A. Similarly, the deposition of the capping layer 150 may result in capping impurities 151. Referring to FIG. 16B, an ammonia plasma treatment 601 may be performed on the semiconductor device as described previously with respect to FIG. 6B. Similarly, the ammonia plasma treatment 601, which removes capping impurities 151 and leaves behind capping microvoids 152 and nitrogen impurities 651, may be performed after the patterning step depicted in FIG. 16E. Further, the capping layer 150 may be deposited with alternating cycles of depositions and ammonia plasma treatments 601 as described above. Alternatively, the treatment cycles may use hydrogen plasma or a combination of hydrogen and ammonia plasmas, such as simultaneously or in an alternating fashion.

Figure 16C:
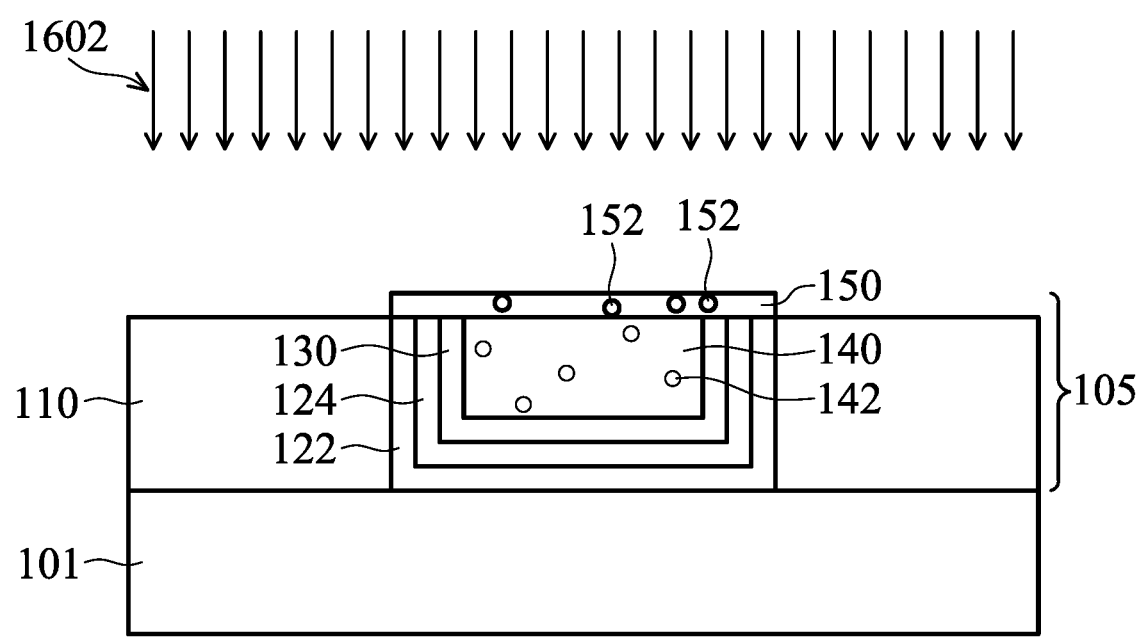

However, referring to FIG. 16C, after the ammonia plasma treatment 601 (or in place of the ammonia plasma treatment 601)—whether before or after patterning—the capping layer 150 may be treated with a hydrogen plasma treatment 1602 to remove some or all of the nitrogen impurities 651 (and some of the remaining capping impurities 151) by reacting with nitrogen atoms and subgroups containing nitrogen atoms to form volatile molecules that will more readily be removed from the system similarly as discussed previously with respect to the hydrogen plasma treatment 401. For example, the hydrogen plasma treatment 1602 may be performed at between about 100 and about 400° C. and at between about 1 mTorr and about 50 mTorr, such as about 3-5 mTorr.

Figure 16D:
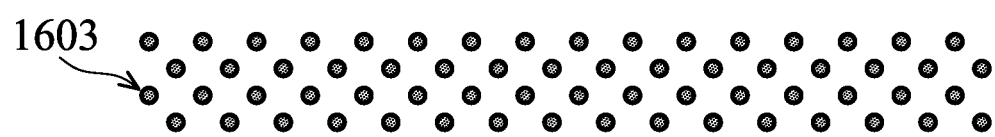
Figure 16D:
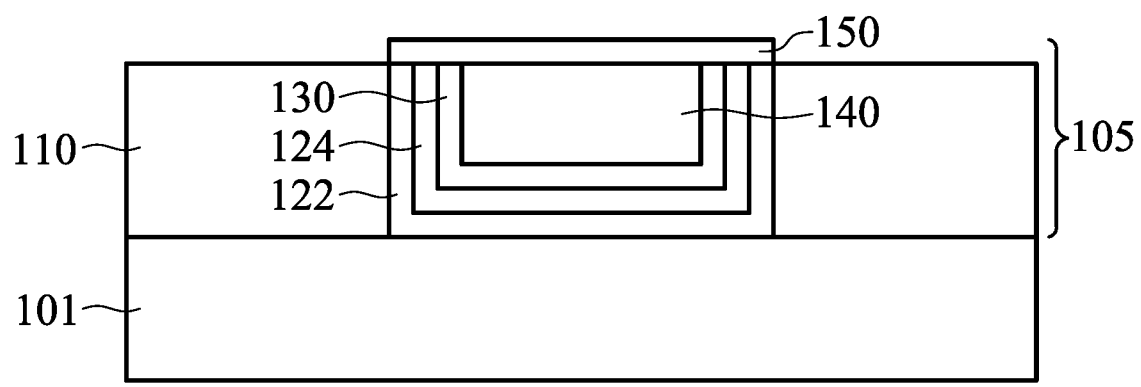

In addition, referring to FIG. 16D, after the hydrogen plasma treatment 1602—whether before or after patterning—the capping layer 150 may be treated with a hydrogen soak treatment 1603 to stabilize the capping layer 150 similarly as discussed previously with respect to the hydrogen soak treatment 1402. As discussed above, during the hydrogen soak treatment 1603, hydrogen gas diffuses into the capping layer 150 to repair deformities and reorient the molecules to fill or reduce the capping microvoids 152 in the capping layer 150. In addition and depending on the parameters of the hydrogen soak treatment 1603, the hydrogen gas may further diffuse into the metal film 140 to repair deformities and reorient the molecules to fill or reduce the wiring microvoids 142 in the metal film 140. The hydrogen soak treatment 1603 may proceed in the same processing chamber that was used for depositing the capping layer 150, for patterning the capping layer 150, for the ammonia plasma treatment 601, and/or for the hydrogen plasma treatment 1602. For example, the hydrogen soak treatment 1603 may be performed at between about 100 and about 400° C., such as about 200° C., and at between about 10 Torr and about 50 Torr, such as about 35 Torr. The atmosphere in the chamber may contain between about 60% hydrogen and about 100% hydrogen, such as 80% hydrogen wherein the remaining 20% is an inert gas, such as argon.

Figure 17:
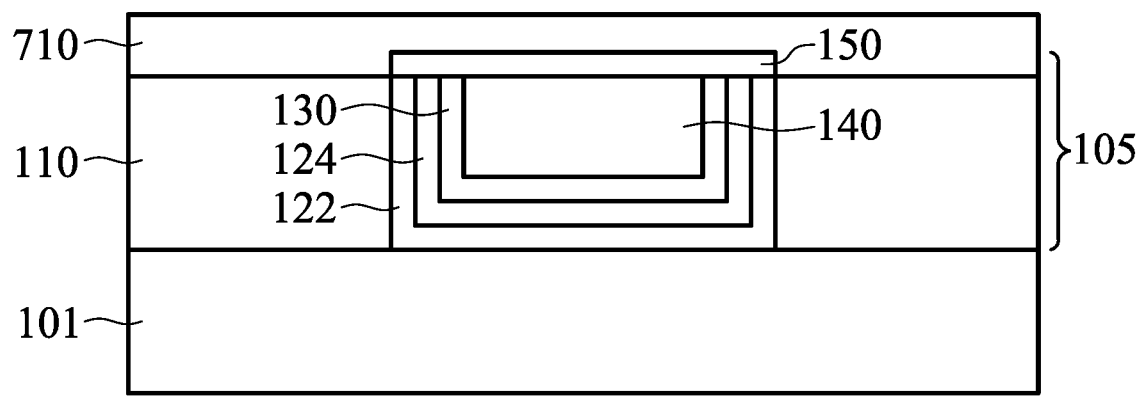
Figure 18:
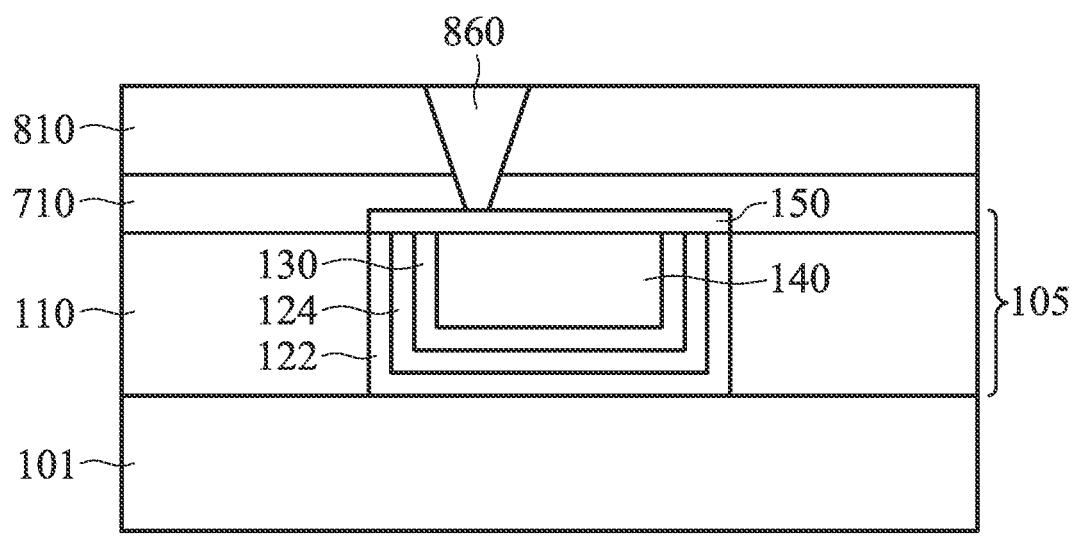
Figure 19:
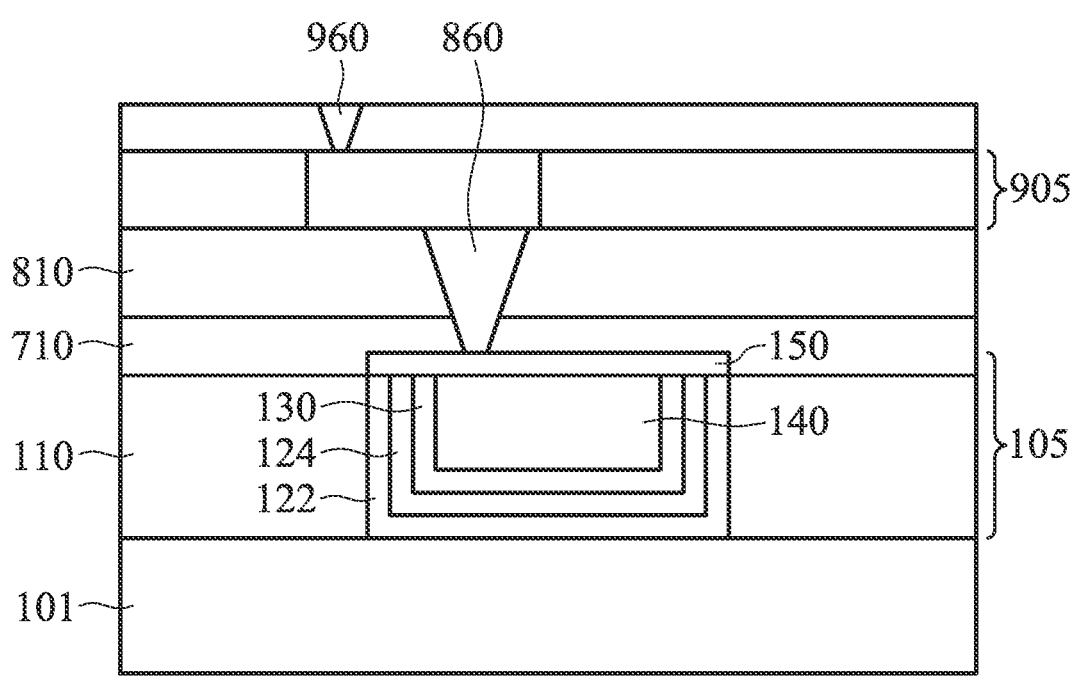

Referring to FIGS. 17-19, the semiconductor fabrication may continue in a similar way as described above with respect to FIGS. 7-9. In particular, referring to FIG. 17, an etch stop layer 710 may be formed over the first wiring layer 105 similarly as discussed previously with respect to FIG. 7. In addition, referring to FIG. 18, a second insulating layer 810 may be formed over the etch stop layer 710 in a similar or different manner as the first insulating layer 110, and a via 860 may be formed through the second insulating layer 810 in a similar or different manner as the metal-containing layers of the first wiring layer 105 as discussed previously with respect to FIG. 8. Further, referring to FIG. 19, one or more additional wiring layers 905 may be formed over the first wiring layer 105 and the via 860, such that the plurality of wiring layers may form the metallization in the BEOL portion of the semiconductor device. Notably, the HPA 1001, as discussed previously with respect to FIG. 10, need not be performed after formation of any of the metallization layers.

Figure 20:
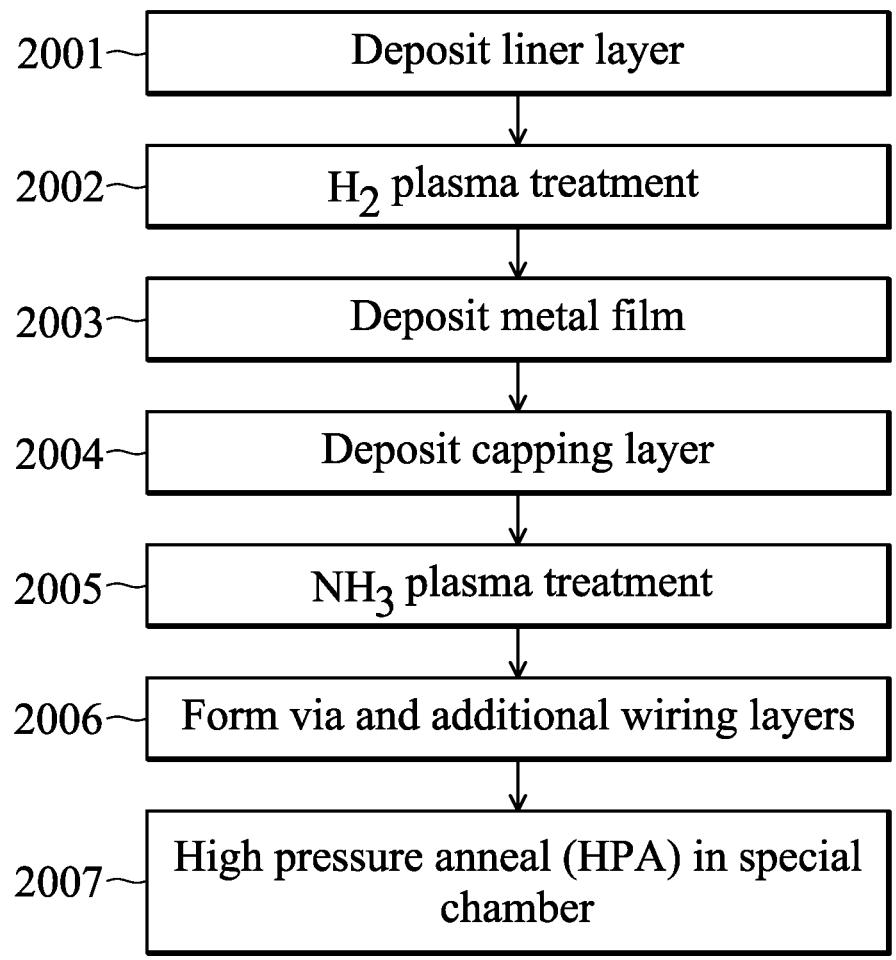
FIG. 20 is a schematic that outlines some of the process steps depicted in FIGS. 1-10, in accordance with some embodiments.

Referring to FIG. 20, one general fabrication method described above may include step 2001 of depositing a liner layer, step 2002 of performing a hydrogen plasma treatment, step 2003 of depositing a metal film, step 2004 of depositing a capping layer, step 2005 of performing an ammonia plasma treatment, optional step 2006 of forming one or more additional wiring layers, and step 2007 of performing a high pressure anneal (HPA). Steps 2001-2006 may be performed in a standard processing chamber. However, step 2007 may require a special processing chamber capable of producing the conditions discussed previously for the HPA 1001.

Figure 21:
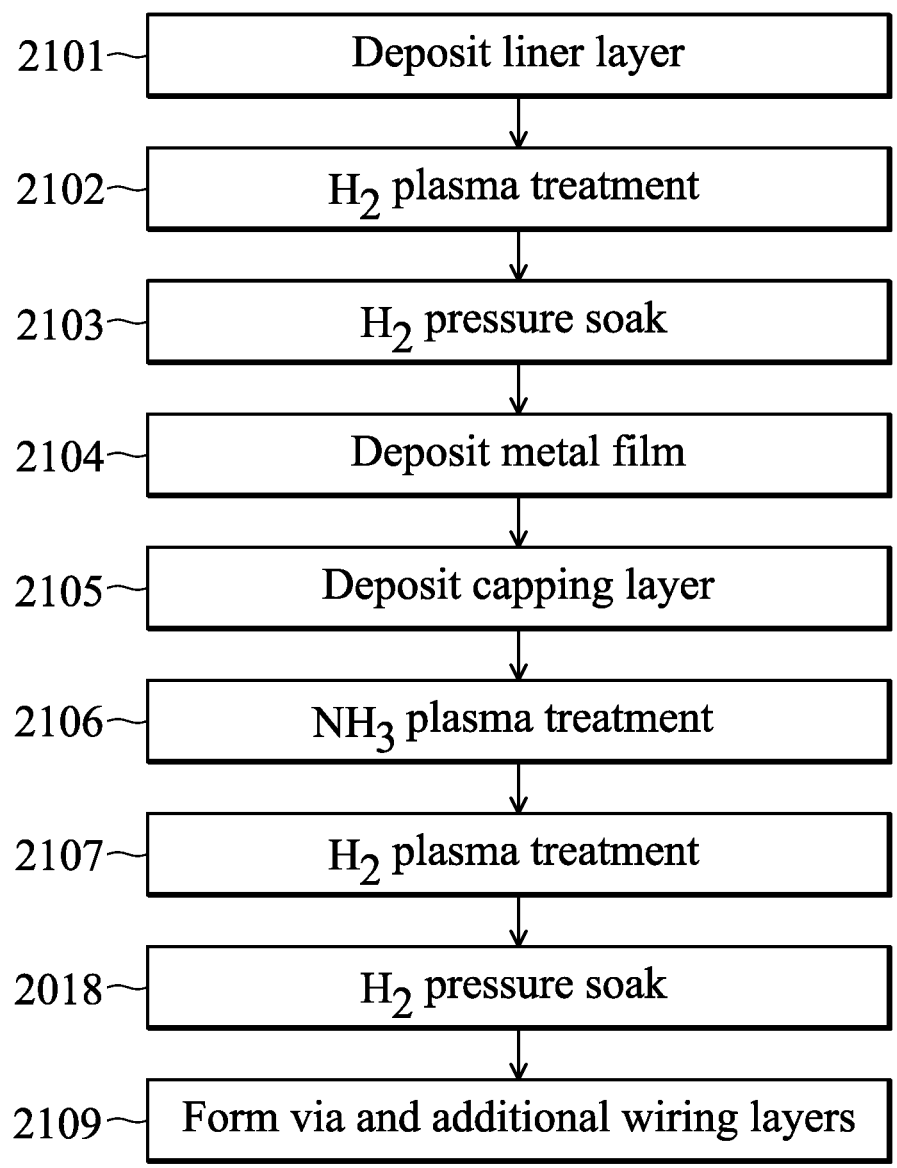
FIG. 21 is a schematic that outlines some of the process steps depicted in FIGS. 11-19, in accordance with some embodiments.

Referring to FIG. 21, another general fabrication method described above may include step 2101 of depositing a liner layer, step 2102 of performing a hydrogen plasma treatment, step 2103 of performing a hydrogen soak treatment, step 2104 of depositing a metal film, step 2105 of depositing a capping layer, step 2106 of performing an ammonia plasma treatment, step 2107 of performing a hydrogen plasma treatment, step 2108 of performing a hydrogen plasma soak, and optional step 2109 of forming one or more additional wiring layers. It should be noted that an HPA 1001 is not necessary for this general fabrication method. Further, in some embodiments only one of step 2106 ammonia plasma treatment and step 2017 hydrogen plasma treatment may be performed.

As described above, the methodology described in FIG. 20 and the methodology described in FIG. 21 are both designed to reduce impurities and microvoids in the liner layer 130. The methodologies, however, may provide different results. For example, in test cases wherein the combined thickness of the first and second barrier layers 122 and 124 was less than 10 Angstroms, the resulting concentration of carbon atoms in the liner layer 130 by the FIG. 21 methodology may be lower than that by the FIG. 20 methodology. Under the same comparison, the resulting concentration of oxygen atoms in the liner layer 130 by the FIG. 21 methodology may be lower than that by the FIG. 20 methodology. Overall, the FIG. 21 methodology results in carbon impurities in the liner layer 130 of less than 1 atomic % and oxygen impurities in the liner layer 130 of less than 1 atomic %.

As described above, the methodology described in FIG. 20 and the methodology described in FIG. 21 are both designed to reduce impurities and microvoids in the capping layer 150 as well. The methodologies, however, may provide different results. For example, in test cases wherein the combined thickness of the first and second barrier layers 122 and 124 was less than 10 Angstroms, the resulting concentration of nitrogen atoms in the capping layer 150 by the FIG. 20 methodology may be about 13 atomic %, and the concentration of nitrogen atoms in the capping layer 150 by the FIG. 21 methodology may be about or below 2 atomic %.

Figure 22A:
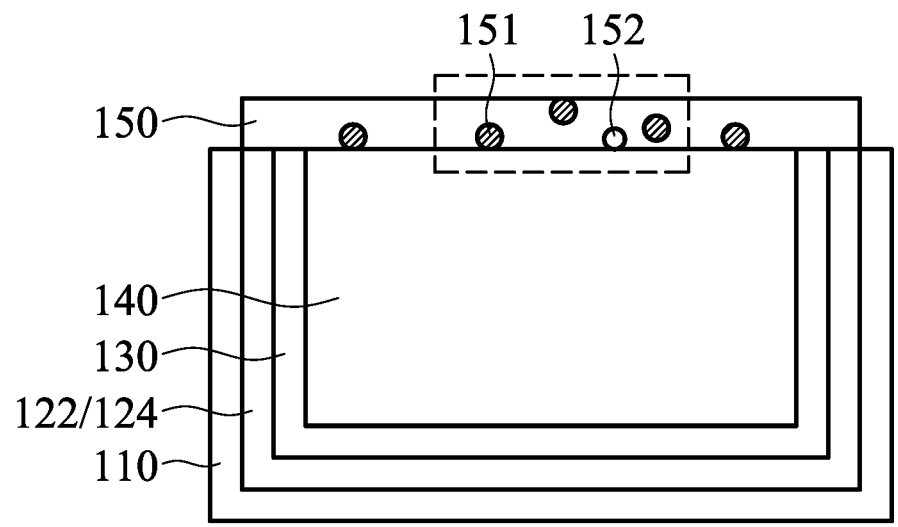
FIGS. 22A, 22B, 23A, 23B, 24A and 24B illustrate general mechanisms during process steps featured in some embodiments.
Figure 22B:
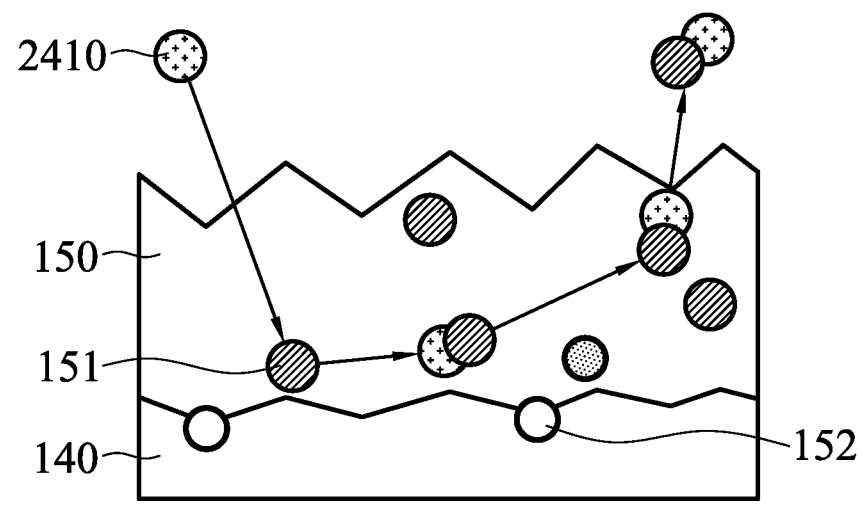

Referring to FIGS. 22A and 224B, illustrating the general mechanism for a hydrogen plasma treatment or an ammonia plasma treatment, plasma ions 2410 will diffuse through the material layer to bond with impurities and carry the impurities out of the material layer. As an example, FIG. 22A depicts impurities (e.g., capping impurities 151) and microvoids (e.g. capping microvoids 152) in the capping layer 150. FIG. 22B depicts a zoomed-in view of the capping layer 150 in which a plasma ion 2410 bonds with a capping impurity 151 to carry it out of the capping layer 150 while leaving behind a capping microvoid 152. A person of ordinary skill in the art would recognize that the mechanism is generally similar between a hydrogen plasma treatment and an ammonia plasma treatment wherein plasma ions bond with carbon, oxygen, and/or nitrogen impurities to carry them out of the liner layer 130 and/or the capping layer 150 and leave behind microvoids 132/152.

Figure 23A:
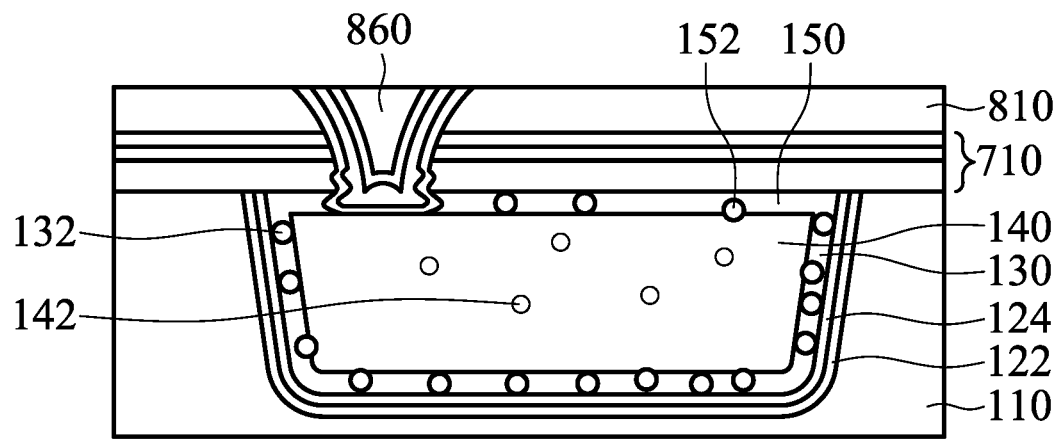
Figure 23B:
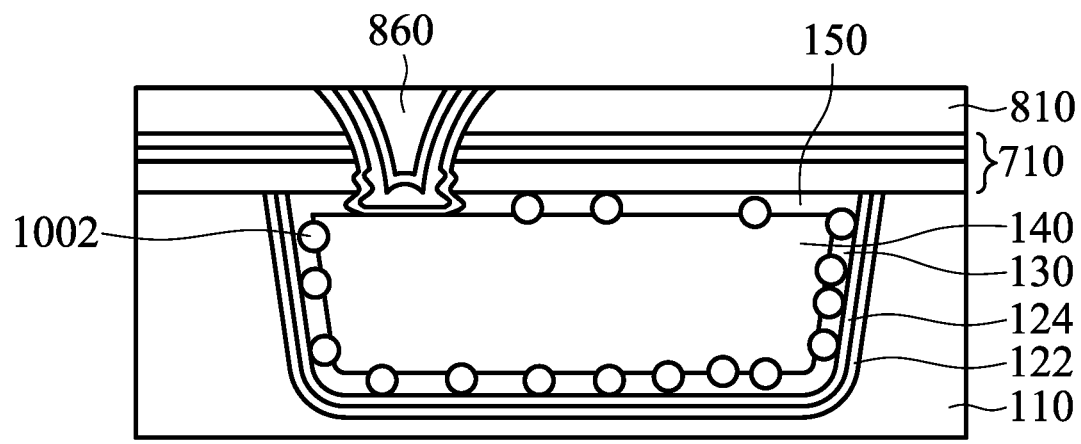

Referring to FIGS. 23A and 23B, illustrating the effect of an HPA on the various microvoids (e.g., the liner microvoids 132, the wiring microvoids 142, and/or the capping microvoids 152), larger voids 1002 may be formed in the semiconductor device by the merging of those various microvoids. In particular, some wiring microvoids 142 may move toward the outer perimeter of the metal film 140 to merge with liner microvoids 132 near, at, or within the liner layer 130. In addition, some wiring microvoids 142 may move toward the outer perimeter of the metal film 140 to merge with capping microvoids 152 near, at, or within the capping layer 150.

Figure 24A:
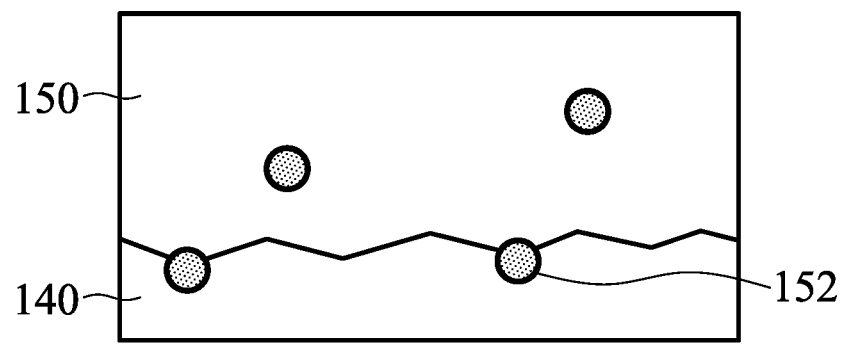
Figure 24B:
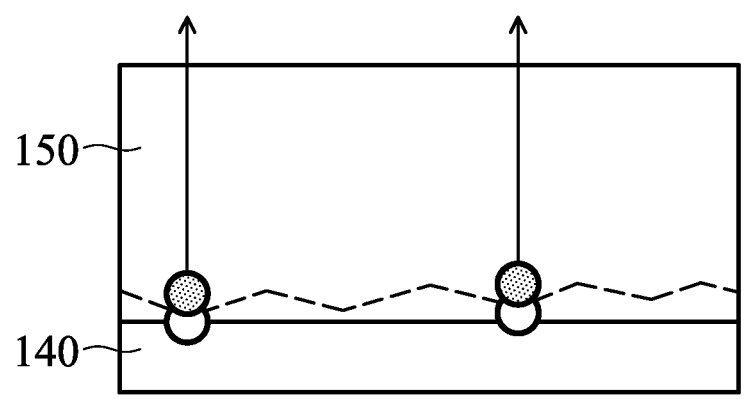

Referring to FIGS. 24A and 24B, illustrating the effect of a hydrogen soak treatment on the various microvoids (e.g., the liner microvoids 132, the wiring microvoids 142, and/or the capping microvoids 152), the hydrogen soak may serve two purposes. First, the hydrogen soak treatment may help to reduce microvoids by facilitating the reorienting and relaxing of a layer with microvoids. Second, the hydrogen soak treatment may smoothen interfaces between two layers as illustrated in FIG. 24B. These effects will tend to increase the reliability of those layers, the adhesion between those layers, and therefore increase the performance and reliability of the integrated circuit.

During the fabrication of a semiconductor device, the semiconductor wafer undergoes an assortment of thermal treatments for a large variety of purposes. Some of the thermal treatments may further include high ambient pressures. Some benefits of the thermal treatments and high pressures include removing impurities and reducing voids and deformities. However, these thermal treatments and high pressures may also introduce a variety of consequences that may reduce the fabrication yield. In addition to eating into the thermal budget of the semiconductor device or of certain features of the semiconductor device, consequences of the thermal treatments and high pressures may include accumulating of voids and/or exacerbating deformities. As discussed herein, those voids are common in the liner layers, wiring layers, and capping layers of the semiconductor device due to the deposition processes as well as the treatments performed to remove impurities. Either of these effects may decrease the performance and reliability of the integrated circuit. As such, a careful selection of thermal treatments and elevated pressure treatments may achieve the same objectives of removing impurities (and potentially improving the removal of impurities) and reducing voids and deformities while also mitigating the accumulation of voids and exacerbating deformities.

The particular use and arrangement of processing steps and treatments results in a better performing and more reliable integrated circuit and, ultimately, semiconductor device. For example, particular treatments may be formed at various times following deposition of a layer and/or throughout the fabrication of the semiconductor device. However, a benefit to performing treatments discussed above is that the removal of impurities and reduction of voids very shortly after the depositions of those particular layers will help prevent those defects from increasing or disrupting the robustness of neighboring features and layers, thereby increasing the fabrication yield.

In an embodiment, a method of forming a semiconductor device includes depositing an insulating layer, patterning the insulating layer to form a groove, depositing a barrier layer in the groove, depositing a liner layer over the barrier layer, performing a first hydrogen plasma treatment on the liner layer, performing a first hydrogen soak treatment on the liner layer, and depositing a metal film over the liner layer. In addition, the depositing of the liner layer may result in some impurities in the liner layer, which may include carbon and oxygen. Further the first hydrogen plasma treatment may remove some of the impurities from the liner layer.

In another embodiment, a method of forming a semiconductor device includes forming a metallization layer and forming an external connector over the metallization layer. In particular, forming the metallization layer includes patterning a dielectric layer to form a groove, depositing a barrier layer over the dielectric layer and in the groove, depositing a liner layer over the barrier layer, performing a plasma treatment with hydrogen on the liner layer, performing a soak treatment with hydrogen on the liner layer, and forming a metal film over the liner layer. In addition, during the formation of the metallization layer, during the formation of the external connector, and in between, an ambient pressure around the semiconductor device remains below 10 atm.

In yet another embodiment, a method of forming a semiconductor device includes depositing a first conductive layer, performing a first hydrogen plasma treatment on the first conductive layer, performing a first hydrogen soak treatment on the first conductive layer, depositing a second conductive layer over the first conductive layer, depositing a third conductive layer over the second conductive layer, performing an ammonia plasma treatment on the third conductive layer, performing a second hydrogen plasma treatment on the third conductive layer, and performing a second hydrogen soak treatment on the third conductive layer. In addition, the first hydrogen soak treatment may utilize a hydrogen concentration of about 80% or greater.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    depositing an insulating layer;
    patterning the insulating layer to form a groove;
    depositing a barrier layer in the groove;
    depositing a liner layer over the barrier layer, the depositing resulting in first impurities in the liner layer, the first impurities comprising carbon and oxygen;
    performing a first hydrogen plasma treatment on the liner layer, the first hydrogen plasma treatment removing some of the first impurities from the liner layer;
    performing a first hydrogen soak treatment on the liner layer;
    depositing a first metal film over the liner layer;
    depositing a capping layer over the first metal film; and
    performing a second hydrogen soak treatment on the capping layer.

2. The method of claim 1, wherein
    an entirety of the groove is filled after the depositing the first metal film, and wherein the depositing the capping layer results in second impurities in the capping layer, the second impurities comprising carbon and oxygen, further comprising:
    performing an ammonia plasma treatment on the capping layer, the ammonia plasma treatment removing some of the second impurities from the capping layer, the ammonia plasma treatment further resulting in capping layer microvoids in the capping layer, the ammonia plasma treatment further resulting in nitrogen impurities in the capping layer; and
    performing a second hydrogen plasma treatment on the capping layer, the second hydrogen plasma treatment further removing some of the nitrogen impurities from the capping layer, and wherein the
    performing the second hydrogen soak treatment on the capping layer removes some of the capping layer microvoids from the capping layer.

3. The method of claim 2, wherein the barrier layer has a thickness of less than 10 Angstroms.

4. The method of claim 2, further comprising:
    forming one or more second metal films over the first metal film; and
    forming an under bump metallurgy (UBM) over the one or more second metal films;
    wherein during an entirety of the depositing the first metal film through the forming the UBM, an ambient pressure around the semiconductor device remains below 10 atm.

5. The method of claim 4, wherein the ambient pressure around the semiconductor device remains below 2 atm.

6. The method of claim 1, wherein performing the first hydrogen plasma treatment results in liner layer microvoids in the liner layer.

7. The method of claim 6, wherein performing the first hydrogen soak treatment removes some of the liner layer microvoids from the liner layer.

8. A method of forming a semiconductor device, the method comprising:
    forming a first metallization layer, the forming the first metallization layer comprising:
        patterning a dielectric layer to form a groove;
        depositing a barrier layer over the dielectric layer and in the groove;
        depositing a liner layer over the barrier layer;
        performing a first plasma treatment on the liner layer, the first plasma treatment comprising hydrogen;

performing a first soak treatment on the liner layer, the first soak treatment comprising hydrogen;

depositing a metal film over the liner layer;

depositing a capping layer over the metal film;

Performing a second plasma treatment on the capping layer, the second plasma treatment comprising ammonia; and performing a second soak treatment on the capping layer, the second soak treatment comprising hydrogen; and forming an external connector over the first metallization layer;

wherein during the forming the first metallization layer, during the forming the external connector, and in between, an ambient pressure around the semiconductor device remains below 10 atm.

9. The method of claim 8, wherein forming the first metallization layer further comprises performing a third plasma treatment on the capping layer, the third plasma treatment comprising hydrogen.

10. The method of claim 9, wherein the second soak treatment is performed at a pressure of between about 20 Torr and about 40 Torr.

11. The method of claim 10, wherein the second soak treatment further comprises between about 80% and about 100% hydrogen.

12. The method of claim 9, wherein:

depositing the capping layer comprises forming a second non-metal impurity in the capping layer;

performing the second plasma treatment comprises:
removing the second non-metal impurity from the capping layer;
forming a capping layer microvoid in the capping layer; and
forming a third non-metal impurity in the capping layer;

performing the third plasma treatment comprises:
removing the third non-metal impurity from the capping layer; and
removing the capping layer microvoid from the capping layer; and performing the second soak treatment comprises removing the capping layer microvoid from the capping layer.

13. The method of claim 8, wherein the first soak treatment is performed at a pressure of between about 20 Torr and about 40 Torr.

14. The method of claim 13, wherein the first soak treatment further comprises between about 80% and about 100% hydrogen.

15. The method of claim 8, wherein:

depositing the liner layer comprises forming a first non-metal impurity in the liner layer;

performing the first plasma treatment comprises:
removing the first non-metal impurity from the liner layer; and
forming a liner layer microvoid in the liner layer; and performing the first soak treatment comprises removing the liner layer microvoid from the liner layer.

16. A method of forming a semiconductor device, the method comprising:

depositing a first conductive layer;

performing a first hydrogen plasma treatment on the first conductive layer;

after the performing the first hydrogen plasma treatment, performing a first hydrogen soak treatment on the first conductive layer, the first hydrogen soak treatment comprising about or greater than 80% hydrogen;

depositing a second conductive layer over the first conductive layer;

depositing a third conductive layer over the second conductive layer;

performing an ammonia plasma treatment on the third conductive layer;

after the performing the ammonia plasma treatment, performing a second hydrogen plasma treatment on the third conductive layer; and after performing the second hydrogen plasma treatment, performing a second hydrogen soak treatment on the third conductive layer.

17. The method of claim 16, wherein:

depositing the first conductive layer comprises depositing first impurities in the first conductive layer, the first impurities comprising carbon and oxygen; and after performing the second hydrogen plasma treatment, a concentration of carbon in the first conductive layer is less than 1% and a concentration of oxygen in the first conductive layer is less than 1%.

18. The method of claim 16, wherein:

performing the ammonia plasma treatment comprises depositing third impurities in the third conductive layer, the third impurities comprising nitrogen; and after the performing the second hydrogen plasma treatment, a concentration of nitrogen in the third conductive layer is less than 2%.

19. The method of claim 16, further comprising:

forming a plurality of conductive layers over the third conductive layer; and forming a UBM over the plurality of conductive layers;

wherein during an entirety of the duration from the depositing the first conductive layer to forming the UBM, an ambient pressure around the semiconductor device remains below 10 atm.

20. The method of claim 16, wherein performing the second hydrogen soak treatment comprises about or greater than 80% hydrogen.

* * * * *

UNITED STATES PATENT AND TRADEMARK OFFICE
CERTIFICATE OF CORRECTION

PATENT NO. : 11,152,258 B2
APPLICATION NO. : 16/573234
DATED : October 19, 2021
INVENTOR(S) : Pei-Hsuan Lee et al.

Page 1 of 1

It is certified that error appears in the above-identified patent and that said Letters Patent is hereby corrected as shown below:

In the Claims

Claim 8, Column 15, Line 5; delete "Performing a second plasma" and insert --performing a second plasma--.

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*